(12) United States Patent
Kamigaichi et al.

(10) Patent No.: US 7,800,091 B2
(45) Date of Patent: Sep. 21, 2010

(54) NONVOLATILE SEMICONDUCTOR MEMORY DEVICE AND MANUFACTURING METHOD THEREOF

(75) Inventors: Takeshi Kamigaichi, Yokohama (JP); Hirofumi Inoue, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 130 days.

(21) Appl. No.: 12/108,783

(22) Filed: Apr. 24, 2008

(65) Prior Publication Data

US 2008/0265235 A1 Oct. 30, 2008

(30) Foreign Application Priority Data

Apr. 27, 2007 (JP) .............................. 2007-119334

(51) Int. Cl.
*H01L 29/04* (2006.01)
(52) U.S. Cl. .............. 257/3; 257/4; 257/5; 257/E29.17; 365/148; 438/573; 438/578
(58) Field of Classification Search ........................ None
See application file for complete search history.

(56) References Cited

U.S. PATENT DOCUMENTS 7,345,899 B2 * 3/2008 Nirschl et al. .................. 365/63
7,598,112 B2 * 10/2009 Park et al. ...................... 438/95
2006/0203541 A1 * 9/2006 Toda .......................... 365/163

FOREIGN PATENT DOCUMENTS

JP 2006-514392 4/2006
KR 10-2006-0110559 10/2006
KR 10-2007-0100667 10/2007

* cited by examiner

*Primary Examiner*—Evan Pert
*Assistant Examiner*—Scott R Wilson
(74) *Attorney, Agent, or Firm*—Oblon, Spivak, McClelland, Maier & Neustadt, L.L.P.

(57) ABSTRACT

A nonvolatile semiconductor memory device includes a first stacked structure in which a plurality of electrode layers are stacked on a substrate via insulating layers, a first resistance changing layer provided on a side surface of the first stacked structure and in contact with the first electrode layers, the first resistance changing layer having a resistance value changing on the basis of an applied voltage, a second electrode layer provided on a side surface of the first resistance changing layer, and a bit line provided on the first stacked structure and electrically connected to the second electrode layer.

19 Claims, 20 Drawing Sheets

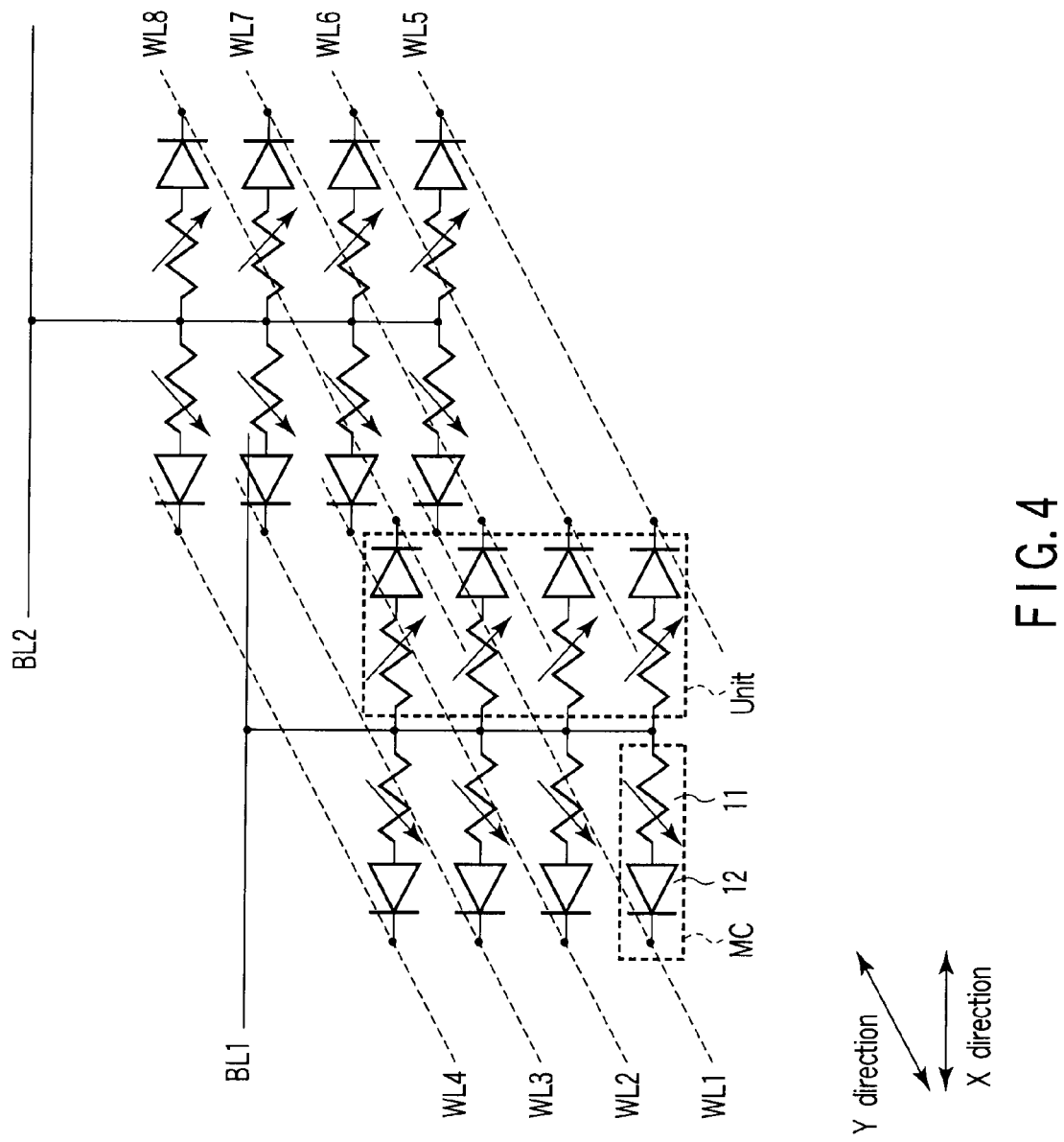
F I G. 4

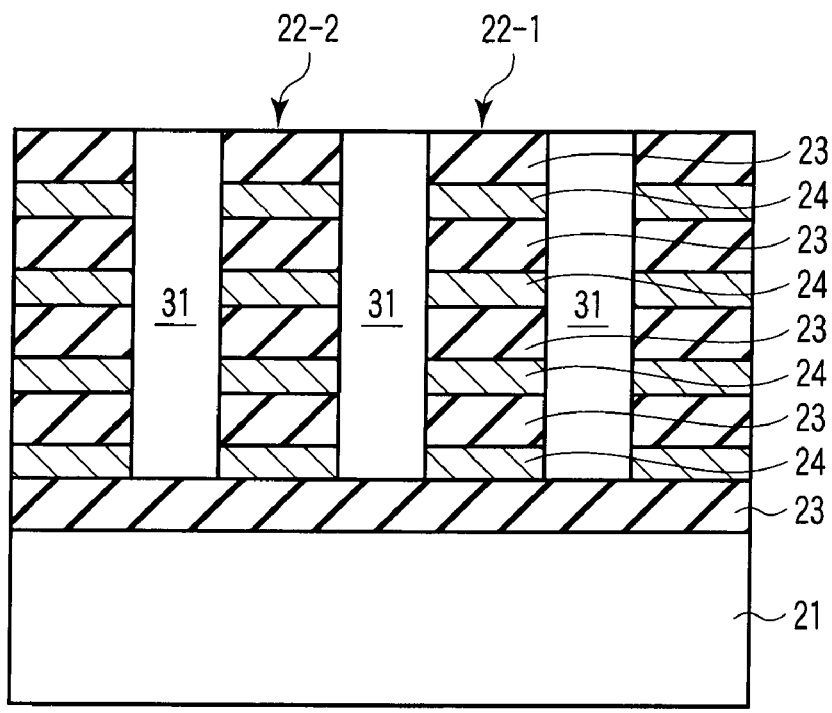
F I G. 7
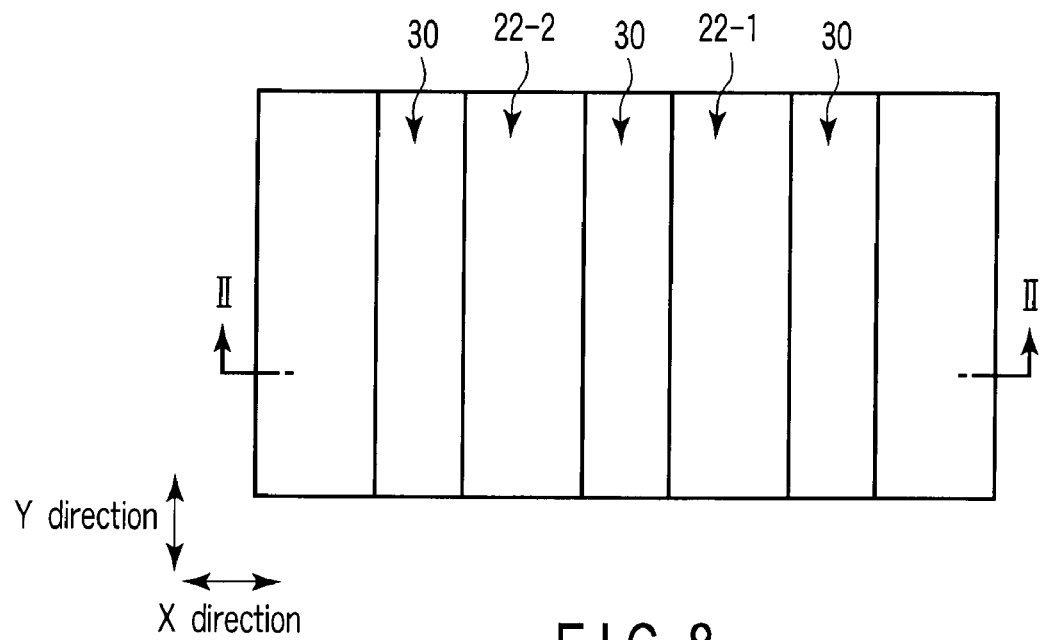
F I G. 8

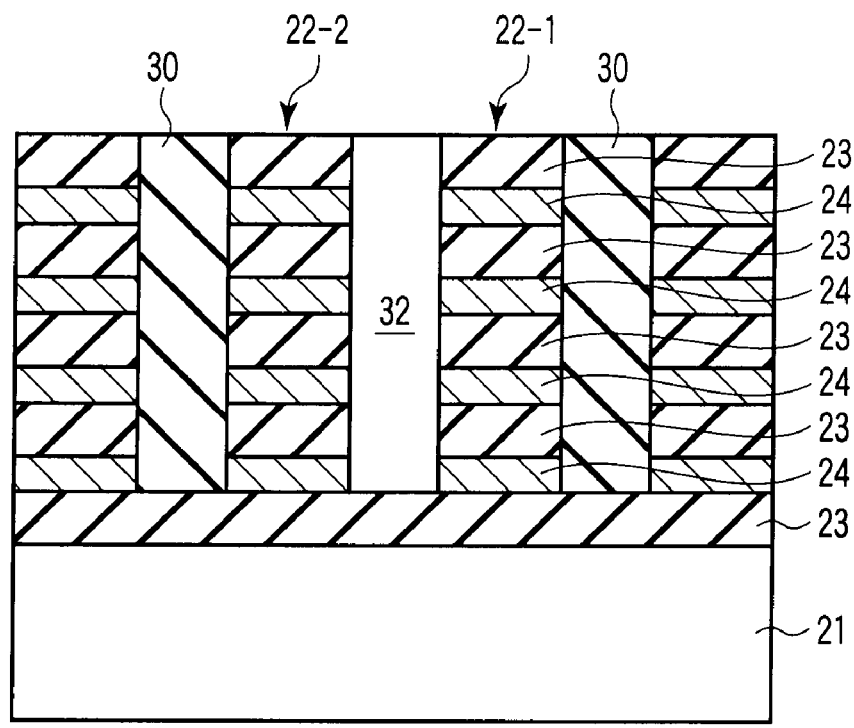
F I G. 11
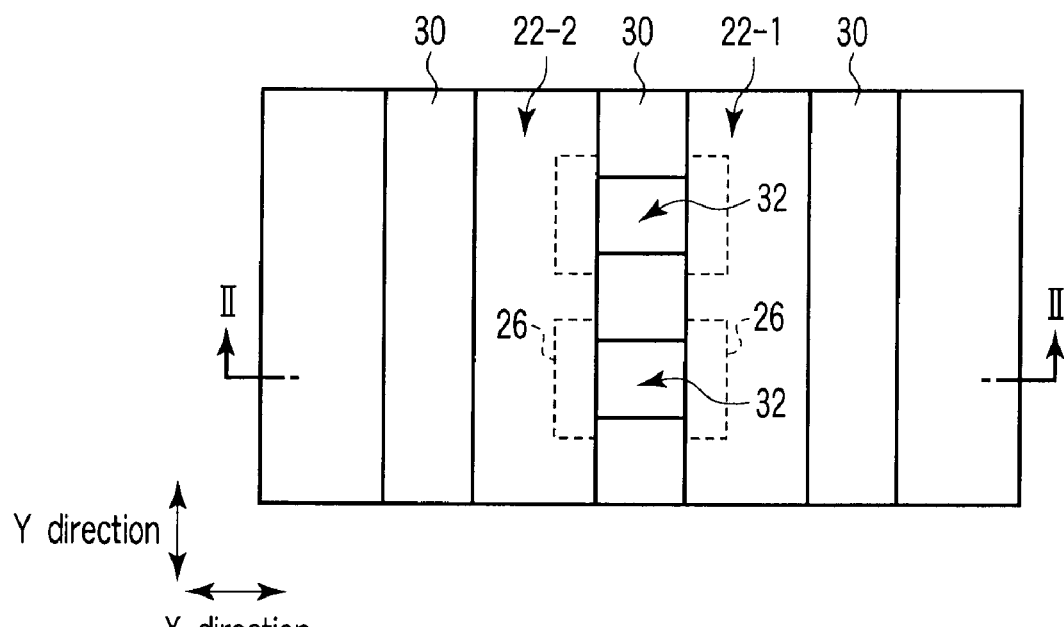
F I G. 12

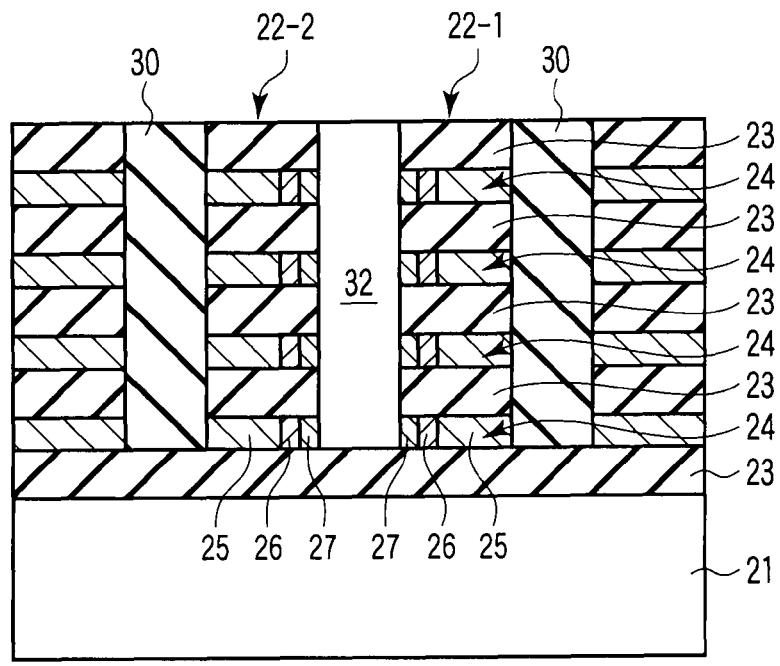
F I G. 15
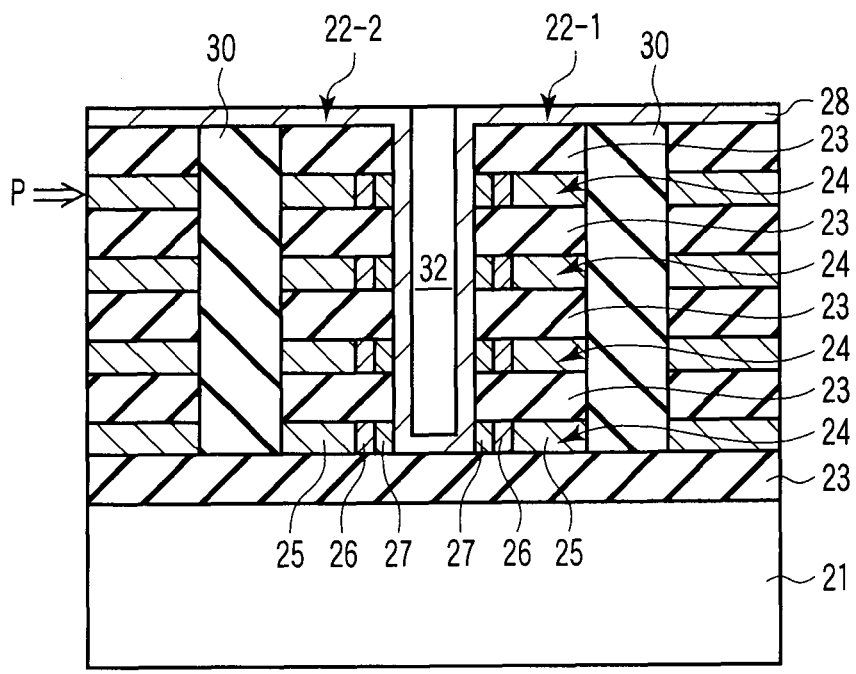
F I G. 16

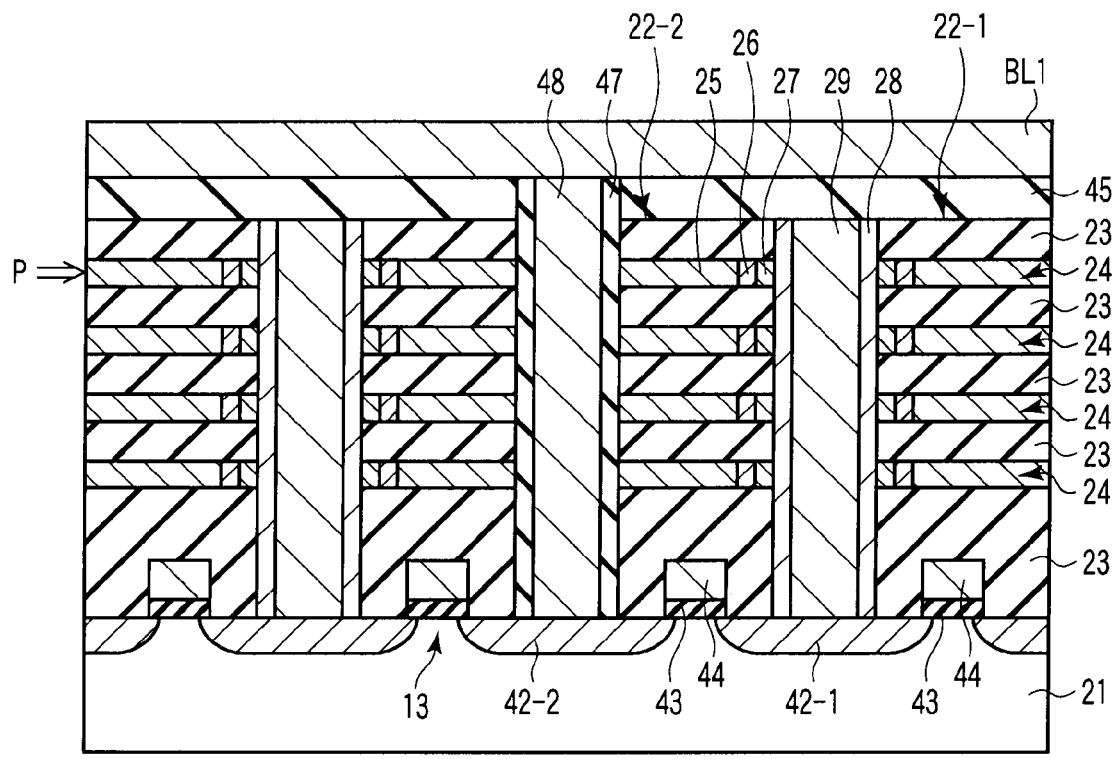
F I G. 21
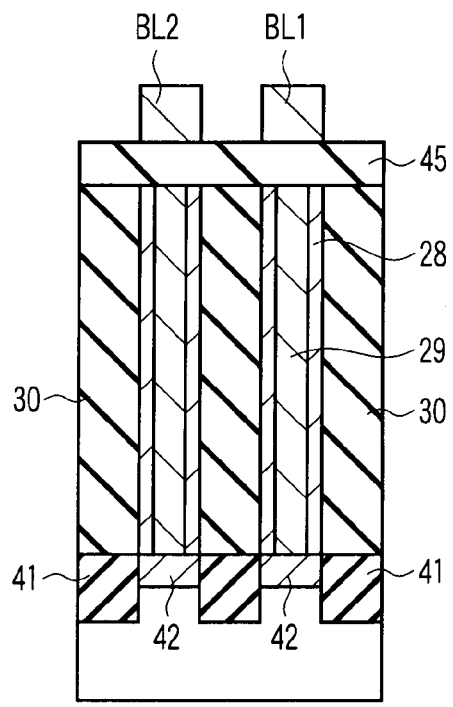
F I G. 22

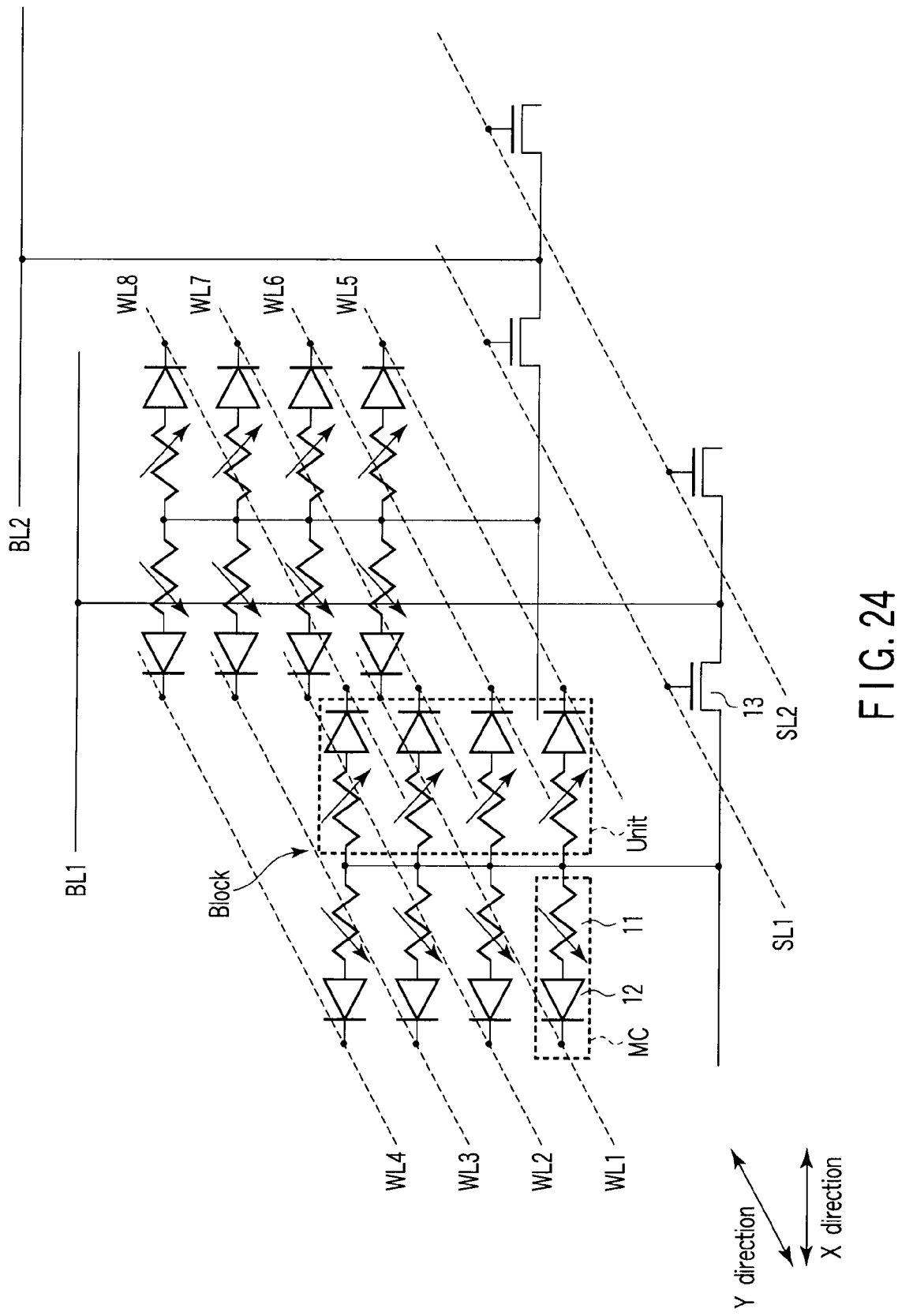
F I G. 24

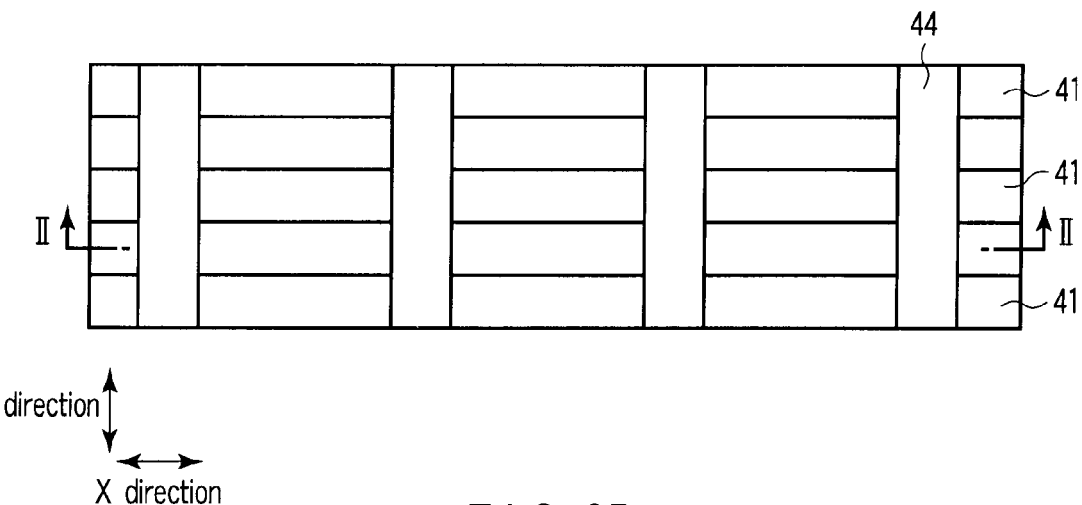
F I G. 25
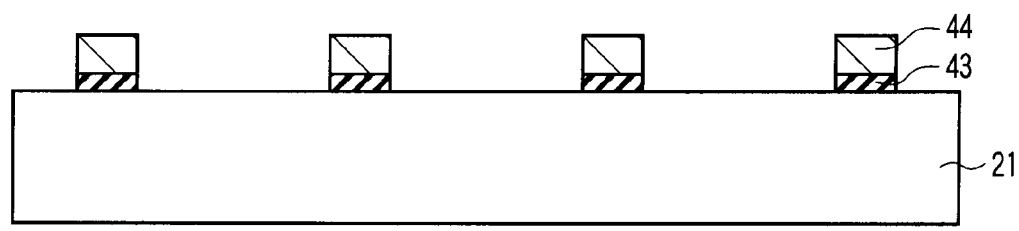
F I G. 26
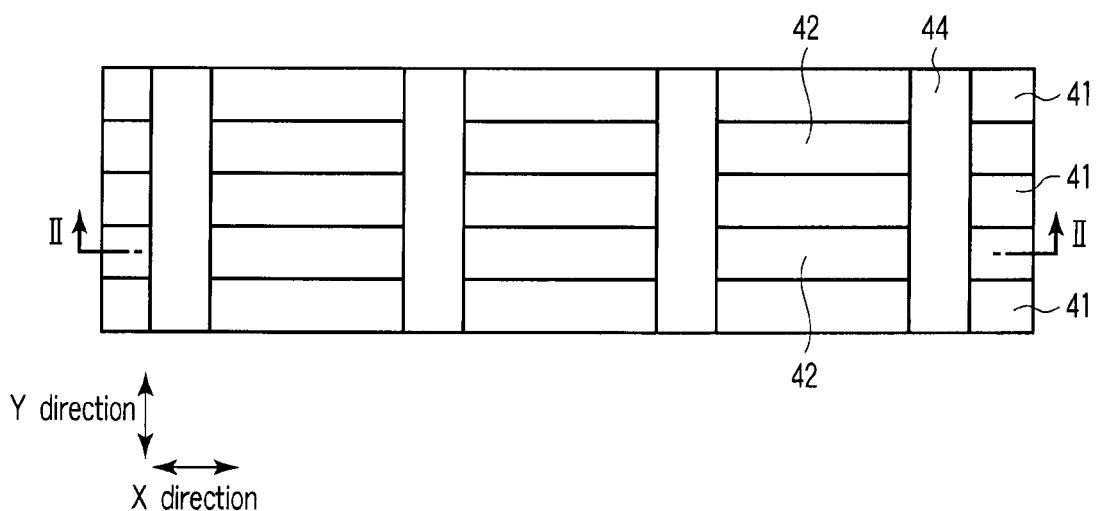
F I G. 27

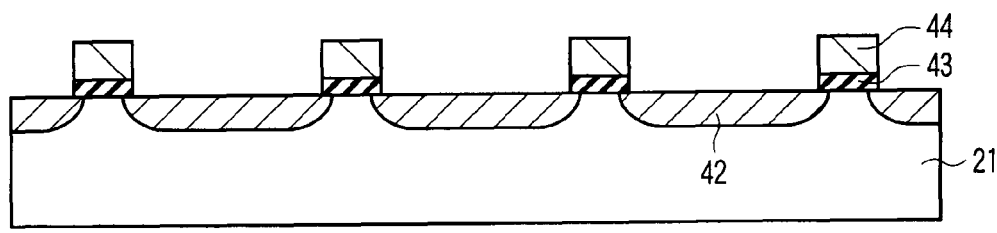
F I G. 28
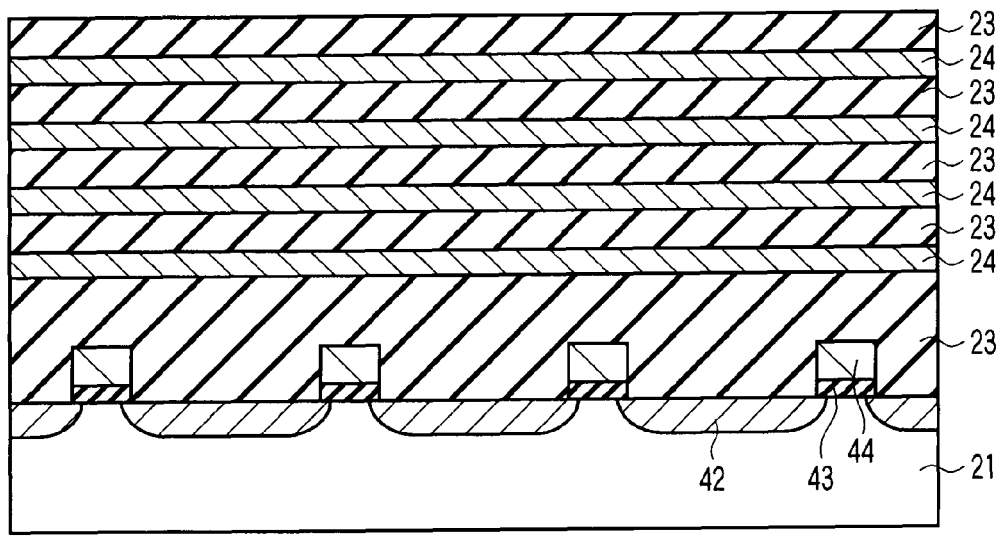
F I G. 29
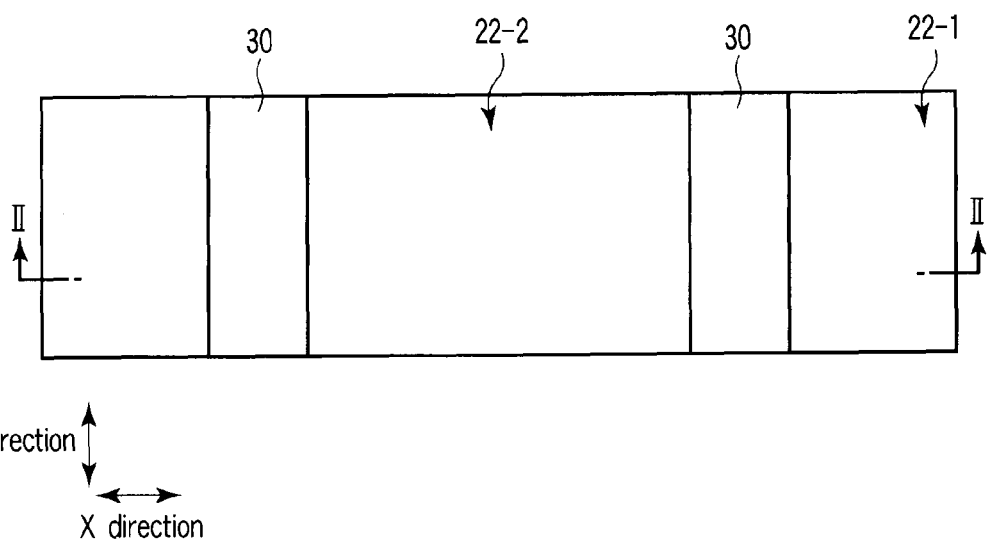
F I G. 30

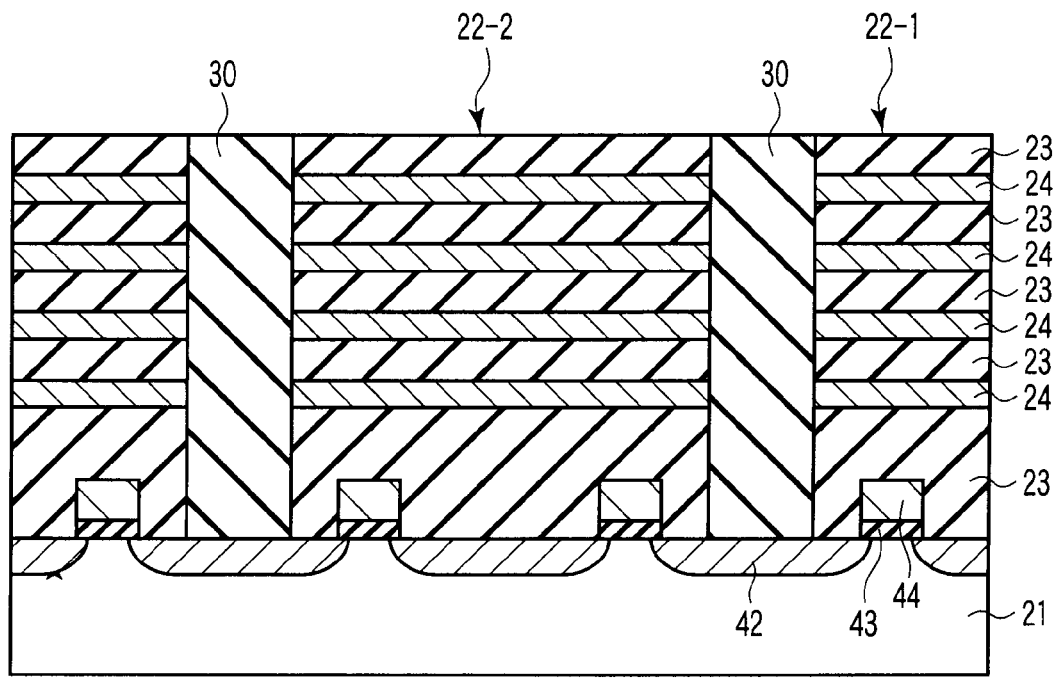
F I G. 31
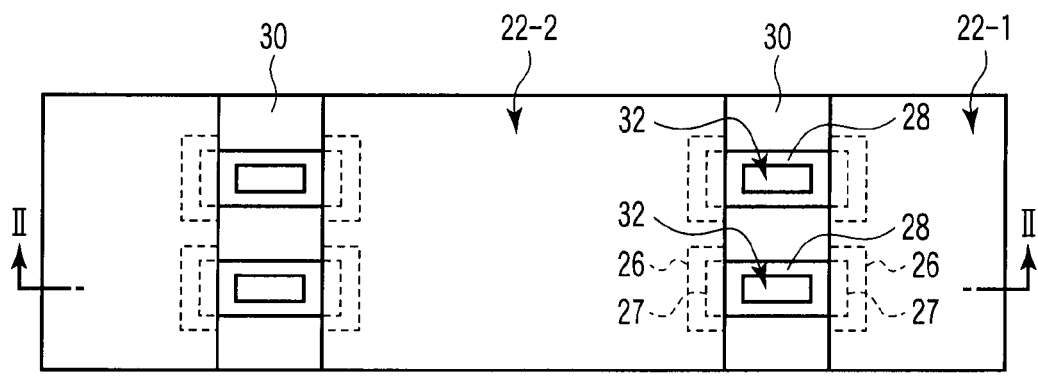
F I G. 32

NONVOLATILE SEMICONDUCTOR MEMORY DEVICE AND MANUFACTURING METHOD THEREOF

CROSS-REFERENCE TO RELATED APPLICATIONS

This application is based upon and claims the benefit of priority from prior Japanese Patent Application No. 2007-119334, filed Apr. 27, 2007, the entire contents of which are incorporated herein by reference.

BACKGROUND OF THE INVENTION

1. Field of the Invention

The present invention relates to a nonvolatile semiconductor memory device and a manufacturing method thereof, and for example, to a nonvolatile semiconductor memory device utilizing a resistance changing layer having a resistance value changing on the basis of an applied voltage, as a memory element.

2. Description of the Related Art

As far as a memory device formed on a plane is concerned, to increase memory capacity, further miniaturization is required in order to increase the number of cells per unit area. However, the further miniaturization is not easy owing to process limitations or the like.

To increase the memory capacity without miniaturization, it is possible to stack and seal a plurality of memory chips in a package or to stack memory cell arrays on silicon to form a three-dimensional memory chip. However, the conventionally proposed method of stacking cell arrays is to simply stack conventional planar cell arrays. If planar cell arrays are stacked in a staircase pattern in a vertical direction, process costs required to form wires and contacts increase; which increase in costs exceeds the effect of high integration.

In the field of nonvolatile memories, efforts have been made to research and develop flash memories as well as ferroelectric memories (FeRAMs), MRAMs (Magnetic RAMs), OUMs (Ovonic Unified Memories), and the like. A resistance changing nonvolatile memory (ReRAM: Resistance RAM) that is different from the above-described nonvolatile memories has recently been proposed. The ReRAM is a nonvolatile memory which allows information to be written by applying a voltage pulse to set a resistance value for a resistance changing layer in a memory cell and which allows information to be read in a nondestructive manner.

Furthermore, as a related technique of this kind, a phase changing memory has been disclosed which has basic cell arrays each comprising a plurality of memory cells formed in a horizontal direction and stacked in the vertical direction (Jpn. Pat. Appln. KOKAI Publication No. 2006-514392).

BRIEF SUMMARY OF THE INVENTION

According to a first aspect of the present invention, there is provided a nonvolatile semiconductor memory device comprising: a first stacked structure in which a plurality of electrode layers are stacked on a substrate via insulating layers; a first resistance changing layer provided on a side surface of the first stacked structure and in contact with the first electrode layers, the first resistance changing layer having a resistance value changing on the basis of an applied voltage; a second electrode layer provided on a side surface of the first resistance changing layer; and a bit line provided on the first stacked structure and electrically connected to the second electrode layer.

According to a second aspect of the present invention, there is provided a nonvolatile semiconductor memory device comprising: a semiconductor substrate; a first select transistor provided on the semiconductor substrate; a stacked structure provided on the first select transistor via an interlayer insulating film and in which a plurality of first electrode layers are stacked via insulating layers; a first resistance changing layer provided on a side surface of the first stacked structure and in contact with the first electrode layers, the first resistance changing layer having a resistance value changing on the basis of an applied voltage; a second electrode layer electrically connected to a first diffusion area of the first select transistor and provided on a side surface of the first resistance changing layer; a bit line provided on the first stacked structure; and a contact which electrically connects a second diffusion area of the first select transistor to the bit line.

According to a third aspect of the present invention, there is provided a method of manufacturing a nonvolatile semiconductor memory device, the method comprising: alternately stacking a plurality of first semiconductor layers of a first conductive type and a plurality of insulating layers to form a stacked structure on a substrate; doping impurity of a second conductive type in side surface portions of the first semiconductor layers to form a plurality of second semiconductor layers in the first semiconductor layers, respectively; allowing side surface portions of the second semiconductor layers to react with metal to form a plurality of first electrode layers in the second semiconductor layers, respectively; forming a resistance changing layer on a side surface of the stacked structure and in contact with the first electrode layers, the resistance changing layer having a resistance value changing on the basis of an applied voltage; and forming a second electrode layer on a side surface of the resistance changing layer.

BRIEF DESCRIPTION OF THE SEVERAL VIEWS OF THE DRAWING

FIG. 4 is a circuit diagram of the ReRAM according to the first embodiment;

FIG. 7 is a sectional view showing a step of manufacturing the ReRAM taken along line II-II shown in FIG. 6;

FIG. 8 is a plan view showing a step of manufacturing the ReRAM which is continued from the step in FIG. 6;

FIG. 11 is a sectional view showing a step of manufacturing the ReRAM taken along line II-II shown in FIG. 10;

FIG. 12 is a plan view showing a step of manufacturing the ReRAM which is continued from the step in FIG. 10;

FIG. 15 is a sectional view showing a step of manufacturing the ReRAM taken along line II-II shown in FIG. 14;

FIG. 16 is a sectional view showing a step of manufacturing the ReRAM which is continued from the step in FIG. 15;

FIG. 21 is a sectional view of the ReRAM taken along line II-II shown in FIG. 20;

FIG. 22 is a sectional view of the ReRAM taken along line III-III shown in FIG. 20;

FIG. 24 is a circuit diagram of the ReRAM according to the second embodiment;

FIG. 25 is a plan view showing a step of manufacturing the ReRAM according to the second embodiment;

FIG. 26 a sectional view showing a step of manufacturing the ReRAM taken along line II-II shown in FIG. 25;

FIG. 27 is a plan view showing a step of manufacturing the ReRAM which is continued from the step in FIG. 25;

FIG. 28 is a sectional view showing a step of manufacturing the ReRAM taken along line II-II shown in FIG. 27;

FIG. 29 is a sectional view showing a step of manufacturing the ReRAM which is continued from the step in FIG. 28;

FIG. 30 is a plan view showing a step of manufacturing the ReRAM which is continued from the step in FIG. 29;

FIG. 31 is a sectional view showing a step of manufacturing the ReRAM taken along line II-II shown in FIG. 30;

FIG. 32 is a plan view showing a step of manufacturing the ReRAM which is continued from the step in FIG. 30;

DETAILED DESCRIPTION OF THE INVENTION

Figure 1:
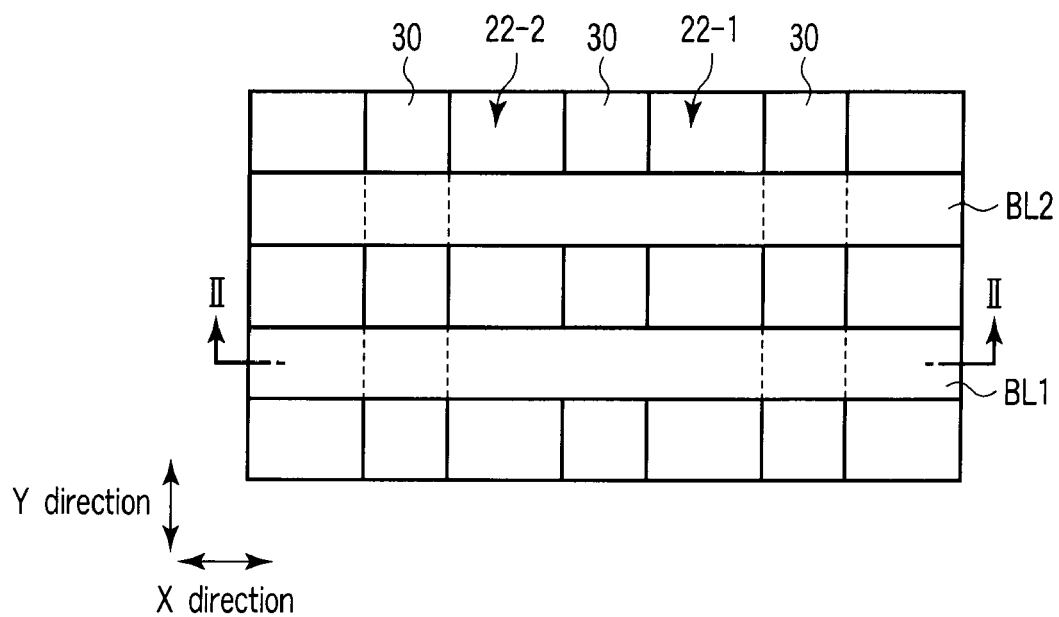
FIG. 1 is a plan view of an ReRAM according to a first embodiment of the present invention.

Embodiments of the present invention will be described with reference to the drawings. In the description below, components having the same functions and configurations are denoted by the same reference numerals. Duplicate descriptions are given only if required.

FIRST EMBODIMENT

Figure 2:
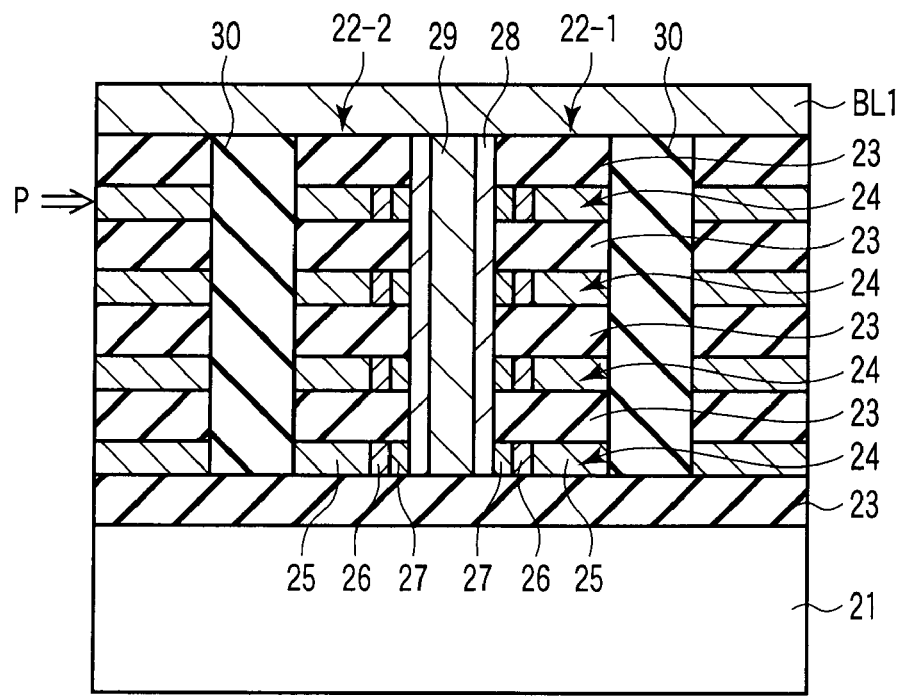
FIG. 2 is a sectional view of the ReRAM taken along line II-II shown in FIG. 1.
Figure 3:
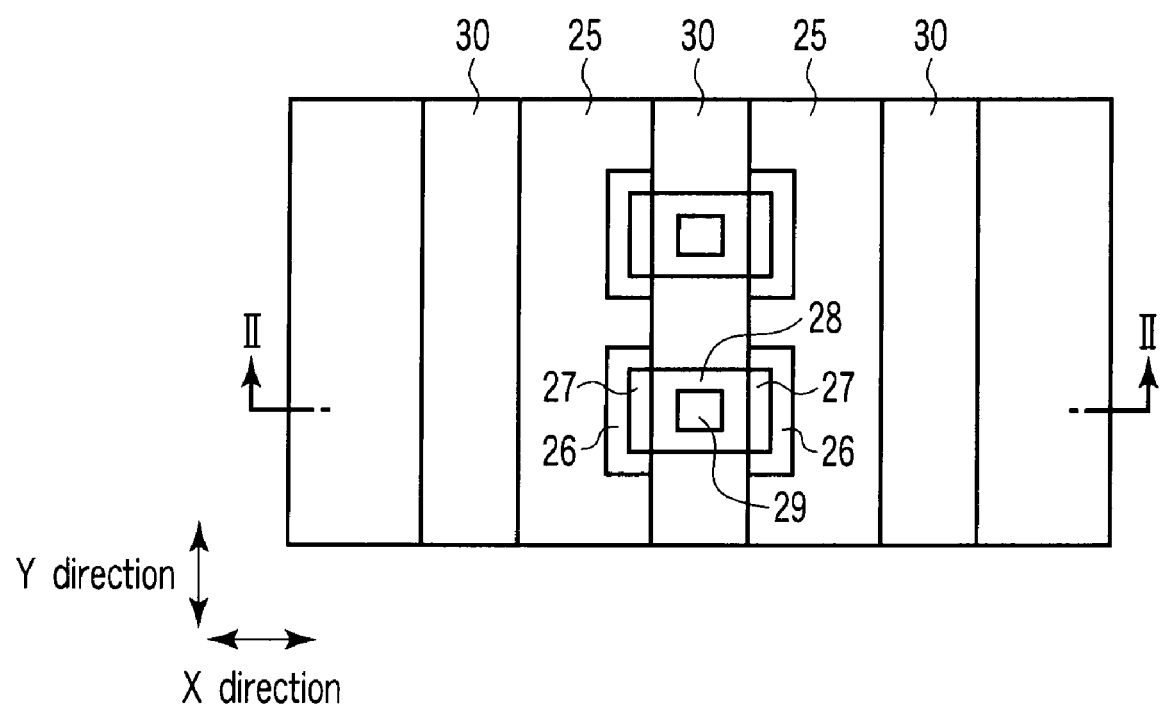
FIG. 3 is a plan view of the ReRAM as viewed from the position of arrow P shown in FIG. 2.

FIG. 1 is a plan view of an ReRAM according to a first embodiment of the present invention. FIG. 2 is a sectional view of the ReRAM taken along line II-II shown in FIG. 1. FIG. 3 is a plan view of the ReRAM as viewed from the position of arrow P shown in FIG. 2.

A plurality of stacked structures 22 constituting an elongate pattern in a Y direction are provided on a substrate 21. Each of the stacked structures 22 comprises a plurality of electrode layers 24 electrically separated from one another by interlayer insulating layers 23. In the present embodiment, the four electrode layers 24 are stacked by way of example. However, the number of layers stacked is not limited. For example, silicon (Si) is used as the substrate 21. For example, silicon oxide is used as the interlayer insulating layers 23.

Each of the electrode layers 24 is composed of an N-type semiconductor layer 25, a P-type semiconductor layer 26, and an electrode layer 27. The N-type semiconductor layer 25 and the P-type semiconductor layer 26 constitute a diode 12. The N-type semiconductor layer 25 also functions as a word line WL. The electrode layer 27 constitutes a first electrode for a resistance changing element 11.

For example, polysilicon having an N-type polarity is used as the N-type semiconductor layer 25. For example, polysilicon having a P-type polarity is used as the P-type semiconductor layer 26. The electrode layer 27 is made up of a conductor and is composed of, for example, a silicide layer formed by allowing polysilicon to react with titanium (Ti), cobalt (Co), or tungsten (W).

A plurality of resistance changing layers 28 corresponding to the number of the memory cell units are provided on one side surface of a stacked structure 22-1. The height of each of the resistance changing layers 28 (the length in the vertical direction) is the same as that from a top surface of the lowermost interlayer insulating layer 23 in the stacked structure 22-1 to a top surface of the stacked structure 22-1. Application of a voltage pulse changes the resistance value of the resistance changing layer 28. That is, the resistance changing layer 28 has a high resistance state (reset state) and a low resistance sate (set state). Application of a voltage pulse switches between the high resistance state and the low resistance state. The two states are utilized as bit information so that the resistance changing layer 28 is used as a memory element.

A perovskite-containing oxide or binary transition metal oxide is used as the resistance changing layer 28. The perovskite-containing oxide may be $Pr_{0.7}Ca_{0.3}MnO_3$, $SrZrO_3/Sr$-$TiO_3$, $Pb(Zr,Ti)O_3/Zn_{0.4}Cd_{0.6}S$, or the like. The binary transition metal oxide may be NiO, TiN, $TiO_2$, $HfO_2$, $ZrO_2$, or the like.

An electrode layer 29, which is a conductor, is provided in contact with a side surface of the resistance changing layer 28. The electrode layer 29 serves as a second electrode for the resistance changing electrode 11. In the present embodiment, one electrode 29 is shared by adjacent stacked structures 22-1 and 22-2. The electrode layer 29 is formed like a pillar on the lowermost interlayer insulating layer 23. The height of the electrode layer 29 (the length in the vertical direction) is the same as that from the top surface of the lowermost interlayer insulating layer 23 in the stacked structure 22 to a top surface of the stacked structure 22.

The resistance changing layer 28 provided in contact with the side surface of the stacked structure 22-1 is composed of the same layer as that of the resistance changing layer 28 provided in contact with the side surface of the stacked structure 22-2. That is, the resistance changing layer 28 surrounds the side surfaces of the pillar-like electrode layer 29.

As shown in FIG. 3, the electrode layer 27 is provided in an area where the electrode layer 27 contacts the resistance changing layer 28. The P-type semiconductor layer 26 surrounds the side surfaces of the electrode layer 27. The electrode layer 24 except for the P-type semiconductor layer 26 and the electrode layer 27 corresponds to the N-type semiconductor layer 25. As described above, the N-type semiconductor layer 25 corresponds to the word line WL and is shared by the memory cell units arranged in the Y direction. The N-type semiconductor layer 25 extends in the Y direction.

The electrode layers 29 adjacent to each other in the Y direction are electrically separated by an insulating layer 30. The stacked structures 22 adjacent to each other in an X direction are electrically separated by the insulating layer 30. Bit lines BL (BL1 and BL2) extending in the X direction are provided on the electrode layer 29.

FIG. 4 is a circuit diagram of the ReRAM shown in FIGS. 1 to 3. A memory cell MC is composed of a resistance changing element 11 and a diode 12. One end of the resistance changing element 11 is connected to the bit line BL. The other end of the resistance changing element 11 is connected to an anode of a diode 12. A cathode of the diode 12 is connected to the word line WL.

Four memory cells arranged in the vertical direction constitute one memory cell unit. The four memory cells included in the unit are connected to the same bit line BL. One bit line BL is shared by two units adjacent to each other in the X direction. The memory cells MC adjacent to each other in the Y direction share the word line WL.

Now, a data write operation in the ReRAM will be described. Data can be written by changing the magnitude of a voltage pulse applied to the resistance changing layer 28. That is, when a write operation is performed on a selected memory cell, first, the word line (selected word line) connected to the selected memory cell is charged with a high voltage. Then, the bit line (selected bit line) connected to the selected memory cell is charged with a high voltage. Finally, the selected word line is discharged to write data to the selected memory cell.

Here, a voltage that changes the resistance changing layer 28 from the high resistance state (reset state) to the low resistance state (set state) is defined as a set voltage Vset. A voltage that changes the resistance changing layer 28 from the low resistance state (set state) to the high resistance state (reset state) is defined as a reset voltage Vreset. Then, the set voltage Vset is set higher than the reset voltage Vreset. The two states are utilized as bit information.

For a data read operation, the resistance changing element 11 is supplied with a sufficiently low read voltage about $1/1,000$ to $1/4$ of the reset voltage Vreset. The resulting change in current is then detected to enable data to be read.

Figure 5:
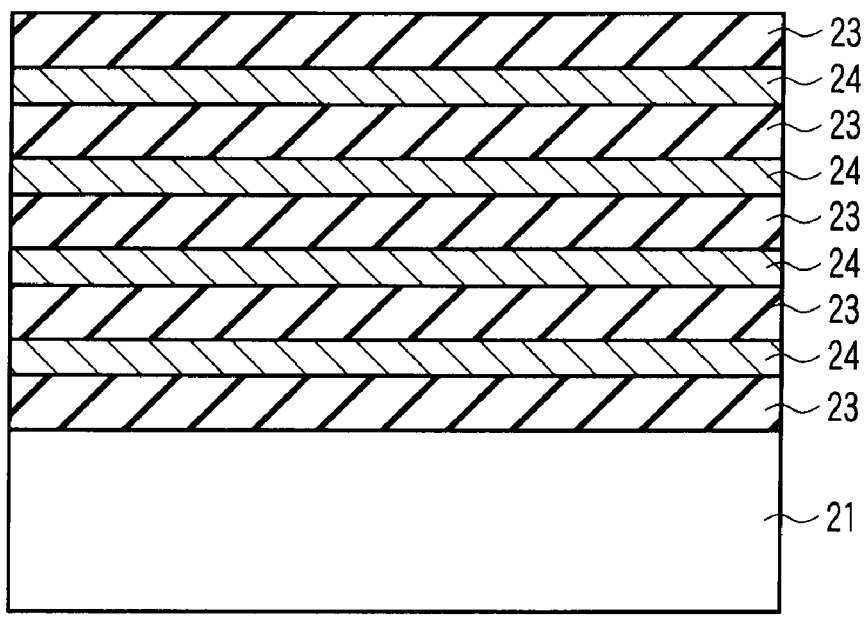
FIG. 5 is a sectional view showing a step of manufacturing the ReRAM according to the first embodiment.

Now, description will be given of an example of a method of manufacturing ReRAM. As shown in FIG. 5, the interlayer insulating layer 23 and the electrode layer 24 are sequentially formed on the substrate 21 by deposition. Similarly, the deposition step is repeated to form a plurality of the electrode layers 24 electrically separated from one another by the interlayer insulating layers 23. Specifically, polysilicon doped with N-type impurities (phosphorous (P), arsenic (As), or the like) is used as the electrode layer 24.

Figure 6:
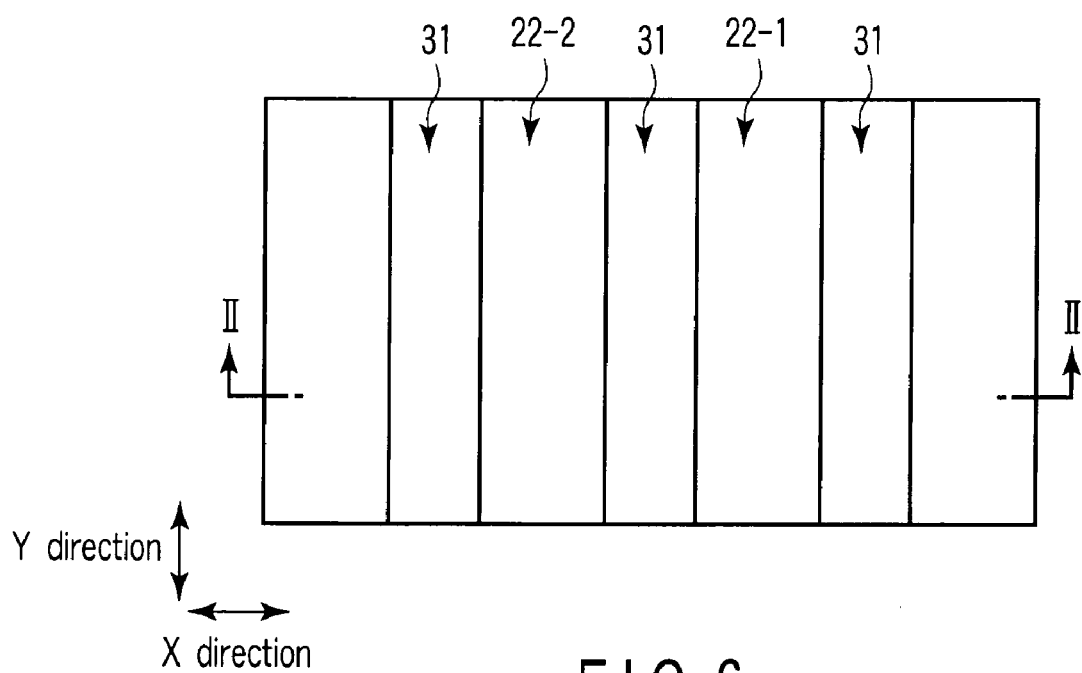
FIG. 6 is a plan view showing a step of manufacturing the ReRAM which is continued from the step in FIG. 5.

Subsequently, as shown in FIGS. 6 and 7, the stacked layer is selectively etched using lithography and RIE (Reactive Ion Etching) so as to be divided into a plurality of pieces. A plurality of openings 31 reach the lowermost interlayer insulating layer 23. Thus, the stacked layer is separated into a plurality of the stacked structures 22 (including 22-1 and 22-2) extending in the Y direction.

Figure 9:
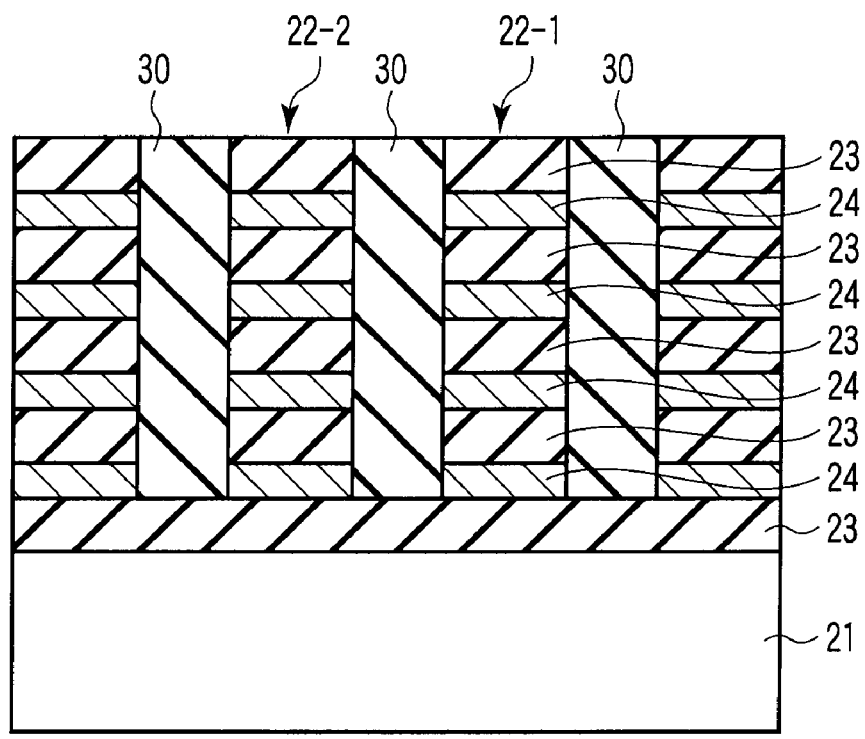
FIG. 9 is a sectional view showing a step of manufacturing the ReRAM taken along line II-II shown in FIG. 8.

Subsequently, as shown in FIGS. 8 and 9, an insulator is buried in the openings 31. The top surface of each of the stacked structures 22 is then flattened using CMP (Chemical Mechanical Polishing). The insulator layers 30 are each formed between the plurality of stacked structures 22.

Figure 10:
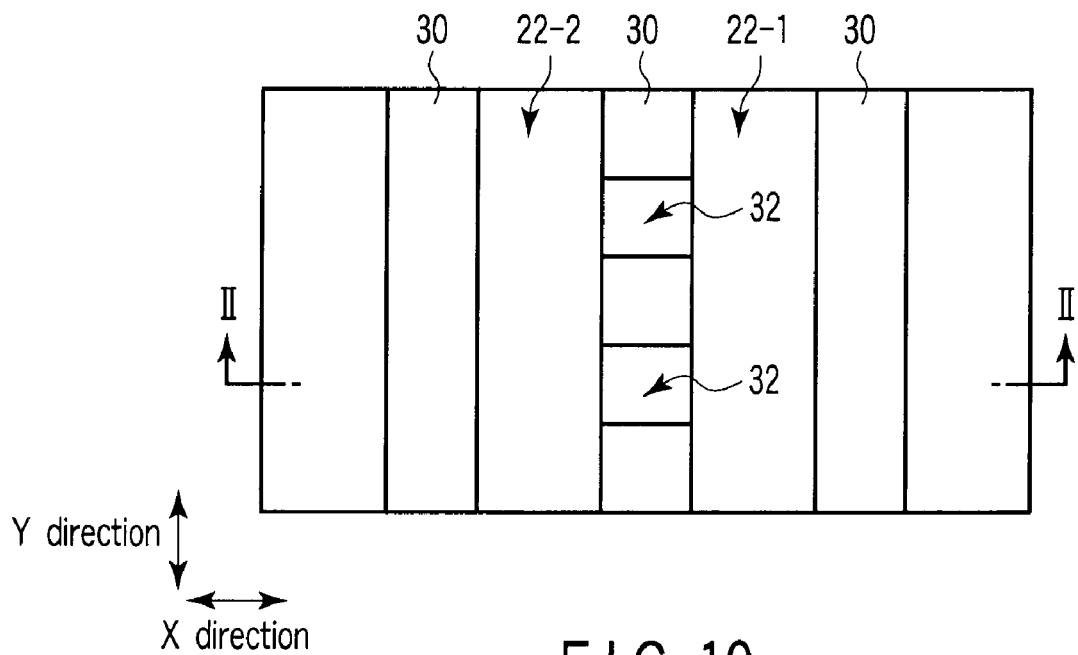
FIG. 10 is a plan view showing a step of manufacturing the ReRAM which is continued from the step in FIG. 8.

Subsequently, as shown in FIGS. 10 and 11, each of the insulating layers 30 is selectively etched using lithography and RIE to expose the side surfaces the stacked structures 22-1 and 22-2 and to form a plurality of openings 30 reaching the lowermost interlayer insulating layer 23.

Figure 13:
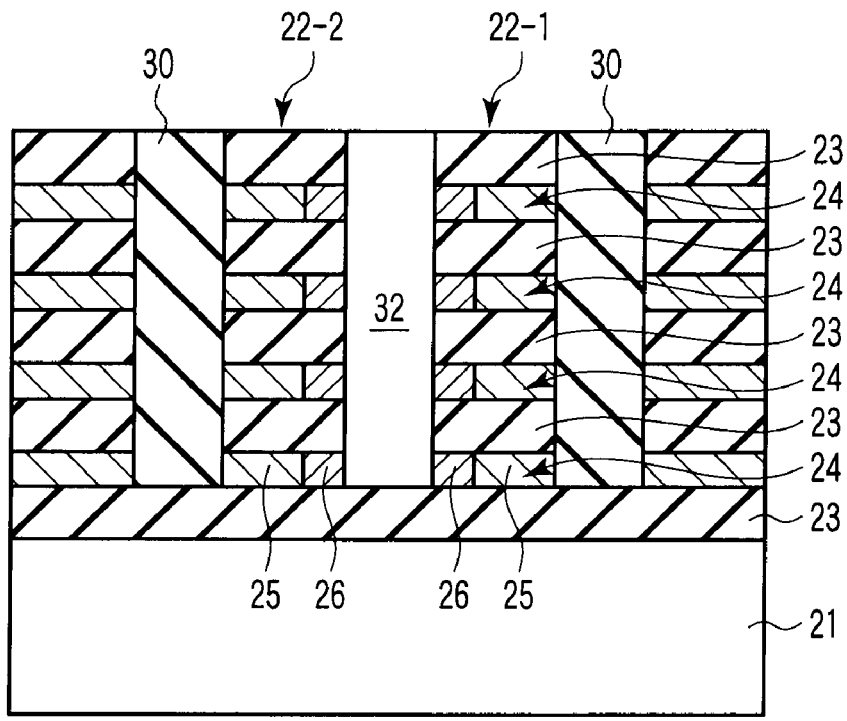
FIG. 13 is a sectional view showing a step of manufacturing the ReRAM taken along line II-II shown in FIG. 12.

Subsequently, as shown in FIGS. 12 and 13, P-type impurities (boron (B) or the like) are doped into an exposed part of each of the electrode layers 24 to form the P-type semiconductor layer in a part of the electrode layer 24. The electrode layer 24 except for the P-type semiconductor layer 26 corresponds to the N-type semiconductor layer 25 functioning as the word line WL. The junction between the N-type semiconductor layer 25 and the P-type semiconductor layer 26 constitutes a diode.

Figure 14:
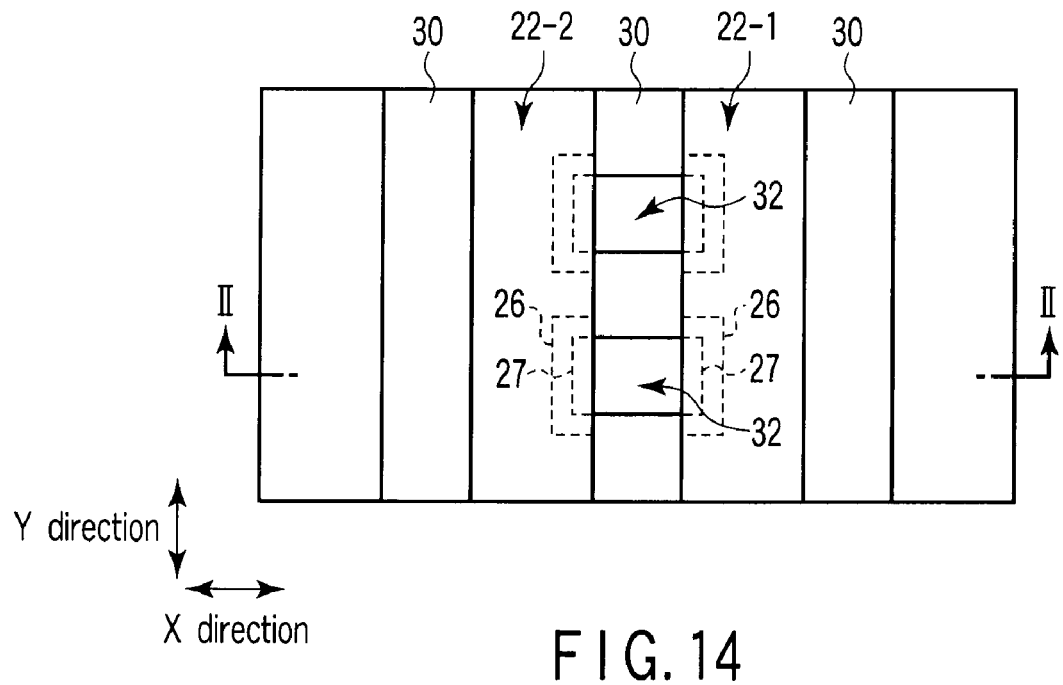
FIG. 14 is a plan view showing a step of manufacturing the ReRAM which is continued from the step in FIG. 12.

Subsequently, as shown in FIGS. 14 and 15, an exposed part of the P-type semiconductor layer 26 is allowed to react with titanium (Ti), cobalt (Co), tungsten (W), or the like and is thus silicided. Thus, the electrode layer 27 is formed in a part of the P-type semiconductor layer 26.

Figure 17:
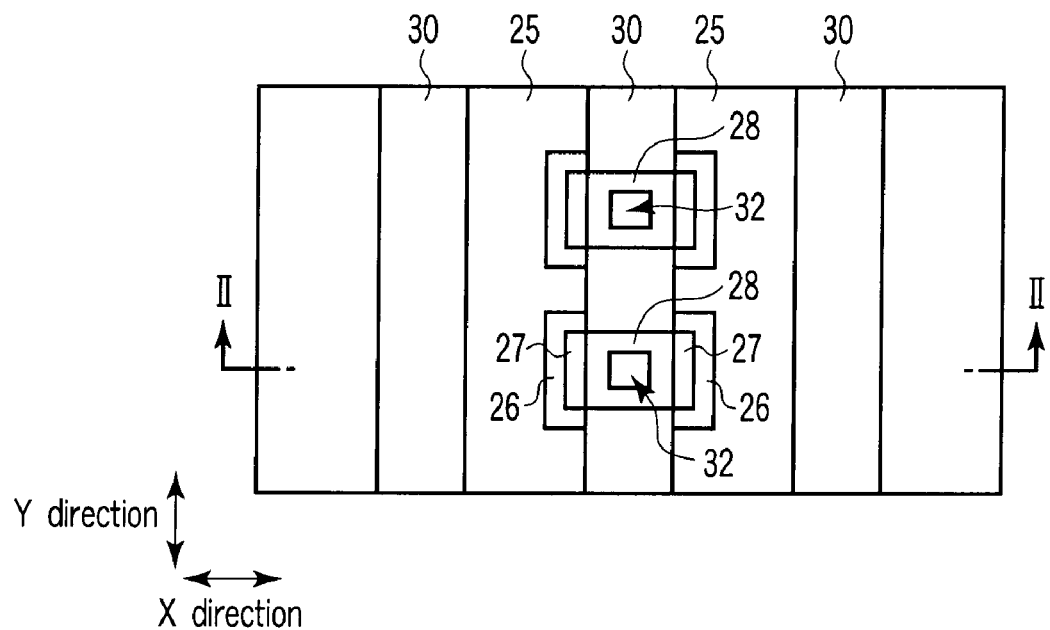
FIG. 17 is a plan view showing a step of manufacturing the ReRAM viewed from the position of arrow P shown in FIG. 16.

Subsequently, as shown in FIGS. 16 and 17, the perovskite-containing oxide or binary transition metal oxide is deposited all over the top surface of the device to form the resistance changing layer 28 on the side surfaces of the stacked structures 22-1 and 22-2. FIG. 17 is a plan view of the ReRAM as viewed from the position of arrow P shown in FIG. 16. The resistance charging layer 28 on the stacked structure 22 may be left or removed using CMP or the like.

Figure 18:
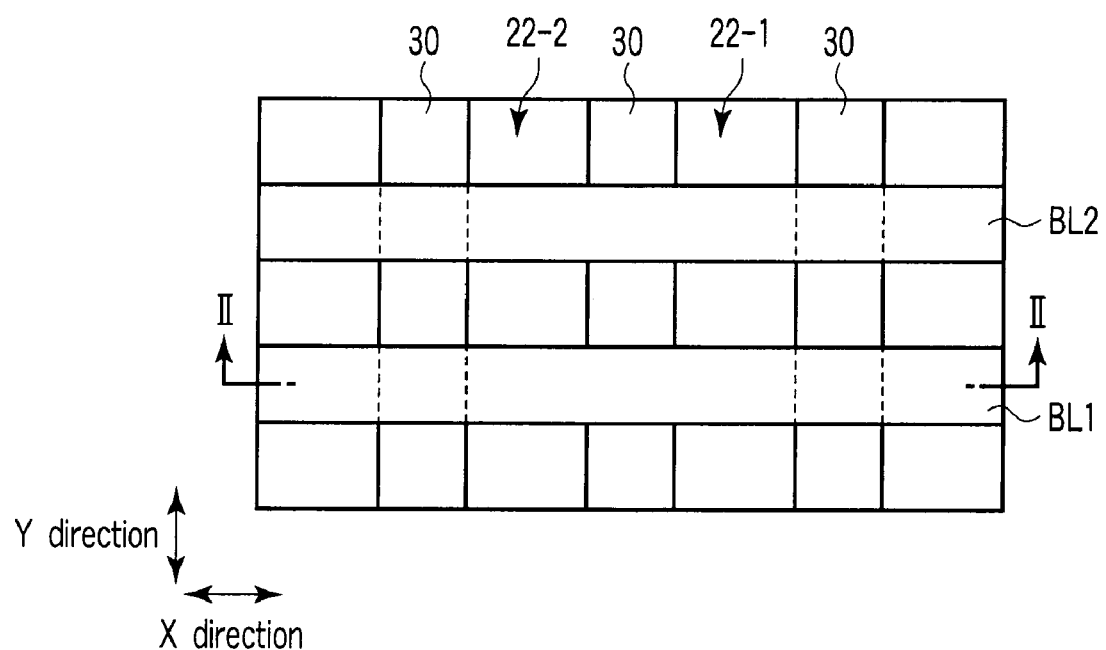
FIG. 18 is a plan view showing a step of manufacturing the ReRAM which is continued from the step in FIG. 16.
Figure 19:
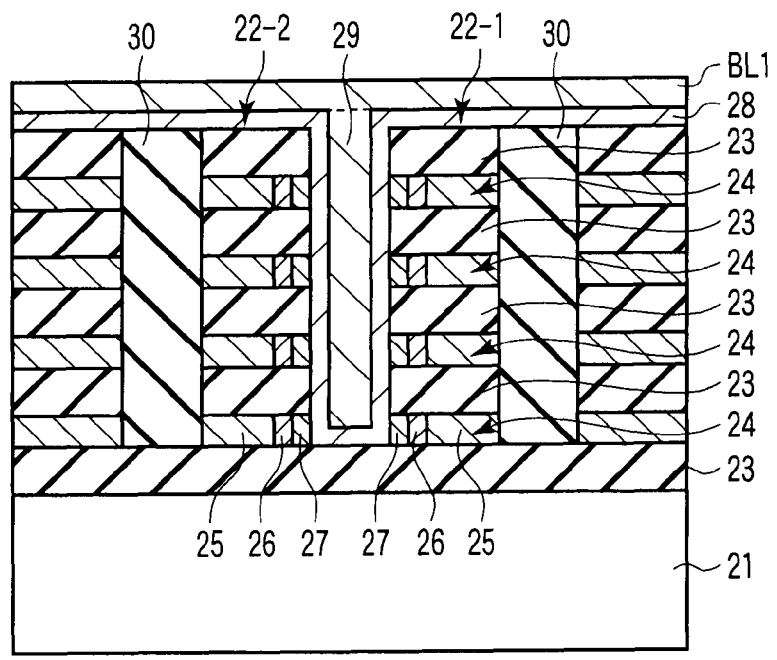
FIG. 19 is a sectional view showing a step of manufacturing the ReRAM taken along line II-II shown in FIG. 18.

Subsequently, as shown in FIGS. 18 and 19, a conductor is formed in the opening 32 and on the resistance changing layer 28. The conductive layer on the resistance changing layer 28 is then patterned using lithography and RIE. The electrode layer 29 is thus formed in contact with the side surface of the resistance charging layer 28. Moreover, the bit line BL electrically connected to the electrode layer 29 is formed on the top surface of the resistance changing layer 28. In this manner, the ReRAM according to the present embodiment is formed.

As described above in detail, the present embodiment allows ReRAM cells to be stacked in the vertical direction. This makes it possible to construct the ReRAM that can be highly integrated while inhibiting an increase in the area of the ReRAM.

Furthermore, since the memory cell MC comprises the diode 12, the possibility of backward flow of current can be prevented. This in turn makes it possible to prevent an erroneous write operation from being performed on the memory cell MC.

Additionally, two units adjacent to each other in the Y direction can share one (electrode layer 29) of the electrodes of the resistance changing element 11. Thus, the area of the ReRAM can be reduced. Moreover, the electrode (electrode layer 27) of the resistance changing element 11, the diode 12, and the word line WL can be formed in the electrode layer 24. Thus, the area of the ReRAM can be reduced.

The direction of the diode 12 is not limited to the one shown in FIG. 4. That is, the diode 12 may be connected in a direction opposite to that shown in FIG. 4. In this case, one end of the resistance changing element 11 is connected to the cathode of the diode 12. The anode of the diode 12 is connected to the word line WL. Moreover, in this variation, the electrode layer 24 is composed of the P-type semiconductor layer 25, the N-type semiconductor layer 26, and the electrode layer 27. For a data write operation, voltage settings for the bit lines BL and the word line WL may be reversed. The ReRAM configured in this manner also exerts effects similar to those described above.

SECOND EMBODIMENT

In a second embodiment, two memory cell units adjacent to each other in the X direction share the word line WL to reduce the number of contacts required to draw out the word line WL.

Figure 20:
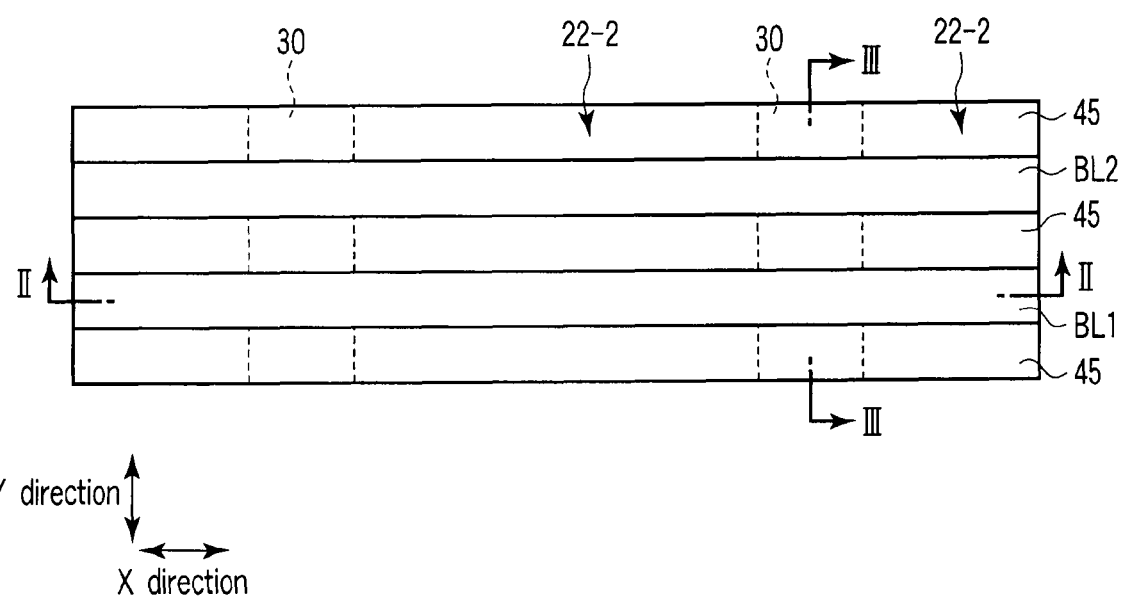
FIG. 20 is a plan view of an ReRAM according to a second embodiment of the present invention.
Figure 23:
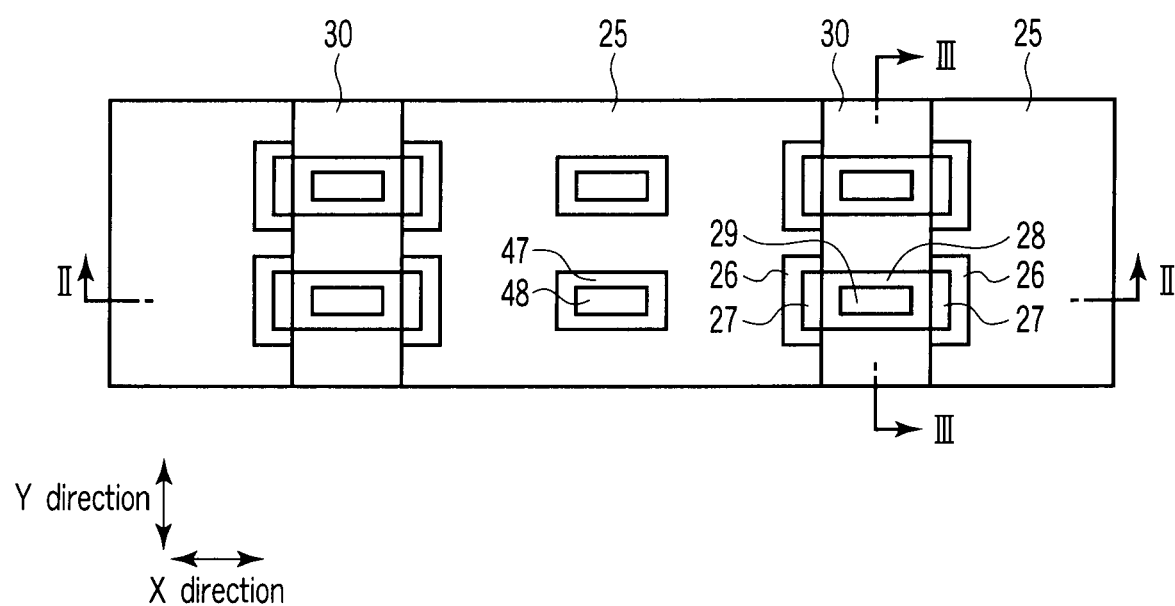
FIG. 23 is a plan view of the ReRAM as viewed from the position of arrow P shown in FIG. 21.

FIG. 20 is a plan view of an ReRAM according to the second embodiment of the present invention. FIG. 21 is a sectional view of the ReRAM taken along line II-II shown in FIG. 20. FIG. 22 is a sectional view of the ReRAM taken along line III-III shown in FIG. 20. FIG. 23 is a plan view of the ReRAM as viewed from the position of arrow P shown in FIG. 21.

A plurality of isolation layers 41 arranged in a pattern extending in the X direction are provided in surface areas of the P-type semiconductor substrate 21. Surface areas of the P-type semiconductor substrate 21 in which the isolation layers 41 are not provided constitute active areas in which elements are formed. The isolation layer 41 is composed of, for example STI (Shallow Trench Isolation). For example, silicon oxide is used as STI 41.

A plurality of source-drain regions 42 (including 42-1 and 42-2) are provided in the active areas (element areas) of the semiconductor substrate 21. Each of the source/drain regions 42 is composed of an $N^+$-type diffusion region formed by doping concentrated $N^+$-type impurities into the semiconductor substrate 21. Gate electrodes 44 are each provided on the semiconductor substrate 21 between the source/drain regions 42 via a gate insulating film 43, and extend in the Y direction. Each of the gate electrodes 44 functions as a select gate line SL. Thus, a plurality of select transistors 13 are provided on the semiconductor substrate 21 so that the select transistors 13 adjacent to each other in the X direction share one of the source/drain regions 42.

A plurality of the stacked structures 22 (including 22-1 and 22-2) each extending in the Y direction are provided on the respective select transistors 13. The plurality of stacked structures 22 are electrically separated from one another by the insulating layers 30. Each of the stacked structures 22 comprises a plurality of the electrode layers 24 electrically separated from one another by the interlayer insulating layers 23. In the present embodiment, the four electrode layers 24 are stacked by way of example. However, the number of stacks is not limited.

The P-type semiconductor layer 26 and the electrode layer 27 are provided in one side surface portion of each of the electrode layers 24. Similarly, the P-type semiconductor layer 26 and the electrode layer 27 are provided in the other side surface portion of the electrode layer 24. A central part of the electrode layer 24 corresponds to the N-type semiconductor layer 25. The junction between the N-type semiconductor layer 25 and the P-type semiconductor layer 26 constitutes the diode 12. The N-type semiconductor layer 25 functions as the word line WL. The electrode layer 27 serves as a first electrode for the resistance changing element 11.

A plurality of the resistance changing layers 28 corresponding to the number of the memory cell units are provided on each side surface of the stacked structure 22. The height of each of the resistance changing layers 28 (the length in the vertical direction) is the same as that of the stacked structure 22. The electrode layer 29, made of a conductor, is provided in contact with the side surface of the resistance changing layer 28. The electrode layer 29 serves as a second electrode for the resistance changing element 11. The electrode layer 29 is formed like a pillar on the source/drain region 42-1. The height of the electrode layer 29 (the length in the vertical direction) is the same as that of the stacked structure 22. In the present embodiment, the adjacent stacked structures 22-1 and 22-2 share one electrode layer 29.

The resistance changing layer 28 provided on one of the side surfaces of the stacked structure 22-1 is composed of the same layer as that of the resistance changing layer 28 provided on one of the side surfaces of the stacked structure 22-2 which faces the stacked structure 22-1. That is, the resistance changing layer 28 surrounds the side surfaces of the pillar-like electrode layer 29. The electrode layers 29 adjacent to each other in the Y direction are electrically separated from each other by the insulating layer 30.

As shown in FIG. 23, the electrode layer 27 is provided in an area where the electrode layer 27 contacts the resistance changing layer 28. The P-type semiconductor layer 26 surrounds the side surfaces of the electrode layer 27. The electrode layer 24 except for the P-type semiconductor layer 26 and the electrode layer 27 corresponds to the N-type semiconductor layer 25. As described above, the N-type semiconductor layer 25 corresponds to the word line WL and is shared by the memory cell units arranged in the Y direction. The N-type semiconductor layer 25 extends in the Y direction.

The bit lines BL (BL1 and BL2) extending in the X direction are provided on the stacked structure 22 via an interlayer insulating layer 45. Each of the bit lines BL is electrically connected to the source/drain region 42-2 via a contact 48. That is, the contact 48 is formed on the source/drain region 42-2 so as to penetrate the stacked structure 22. The contact 48 is peripherally covered with an insulating film 47 and thus prevented from being electrically connected to the N-type semiconductor layer 25.

FIG. 24 is a circuit diagram of the ReRAM shown in FIGS. 20 to 23. The memory cell MC is composed of the resistance changing element 11 and the diode 12. One end of the resistance changing element 11 is connected to the bit line BL via the select transistor 13. The other end of the resistance changing element 11 is connected to the anode of a diode 12. The cathode of the diode 12 is connected to the word line WL. A gate of the select transistor 13 is connected to a select gate line SL.

Four memory cells arranged in the vertical direction constitute one memory cell unit. A block composed of two units adjacent to each other in the X direction is connected to the same select transistor 13. Two blocks adjacent to each other in the X direction are connected to the same bit line BL via the select transistor 13. Two units adjacent to each other in the X direction via the contact plug 48 share the word line WL.

For a data write operation, the block to be connected to the bit line BL can be selected by controlling the select gate line SL. Furthermore, any memory cell MC can be selected by controlling the select gate line SL and the word line WL. The remaining part of the data write operation is the same as that in the first embodiment.

Now, description will be given of an example of a method of manufacturing the ReRAM. As shown in FIGS. 25 and 26, a plurality of the striped isolation layers 41 each extending in the X direction are formed. Each of the isolation layers 41 is formed by, for example, forming a trench in the semiconductor substrate 21 using lithography and RIE and burying an insulator such as silicon oxide in the trench.

Subsequently, the gate insulating film 43 and the gate electrode 44 are sequentially formed by deposition and then patterned using lithography and RIE. Thus, a plurality of the gate electrodes 44 each extending in the Y direction are formed on the semiconductor substrate 21 via the respective gate insulating films 43.

Subsequently, as shown in FIGS. 27 and 28, concentrated $N^+$-type impurities are doped in the semiconductor substrate 21 through the gate electrodes 44 as a mask. Thus, a plurality of the source/drain regions 42 are each formed between the gate electrodes 44.

Subsequently, as shown in FIG. 29, the interlayer insulating layers 23 and the electrode layers 24 are sequentially formed on the semiconductor substrate 21 by deposition.

Similarly, the deposition step is repeated to form a plurality of the electrode layers 24 electrically separated from one another by the interlayer insulating layers 23. Specifically, polysilicon doped with N-type impurities (phosphorous (P), arsenic (As), or the like) is used as the electrode layer 24.

Subsequently, as shown in FIGS. 30 and 31, the stacked layer is selectively etched using lithography and RIE so as to be divided into a plurality of pieces. A plurality of the openings 31 reach the semiconductor substrate 21. An insulator is buried in the openings to form the insulating layers 30 on the semiconductor substrate 21 each of which extends in the Y direction. The insulating layers 30 separate the stacked layer into a plurality of the stacked structures 22 (including 22-1 and 22-2) each extending in the Y direction. The top surface of each of the stacked structures 22 is then flattened using CMP.

Figure 33:
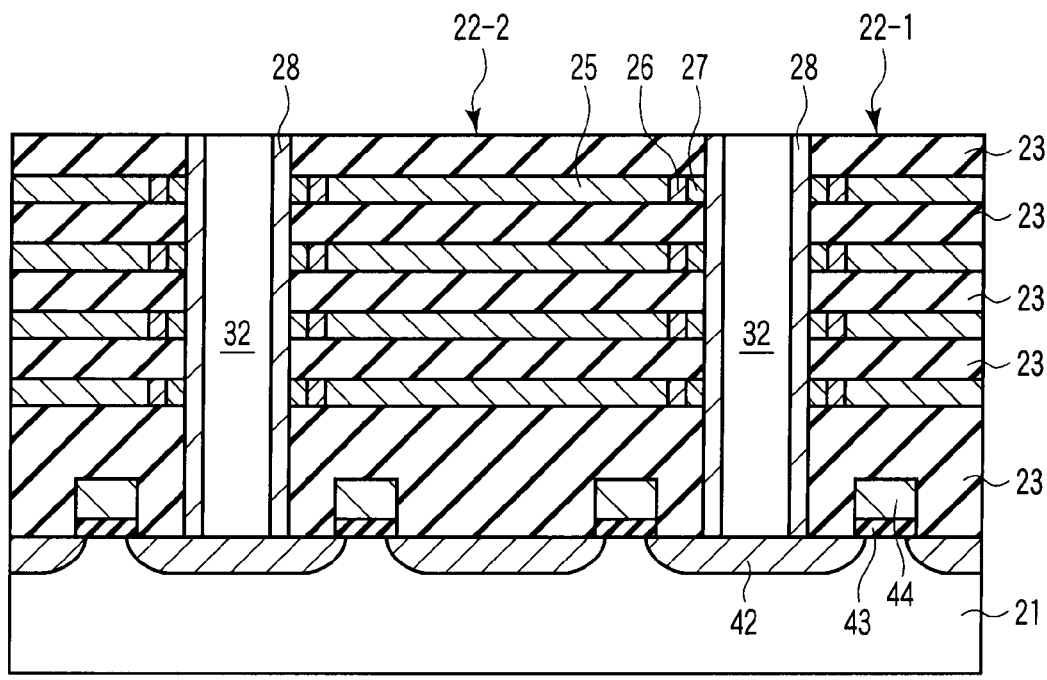
FIG. 33 is a sectional view showing a step of manufacturing the ReRAM taken along line II-II shown in FIG. 32.

Subsequently, as shown in FIGS. 32 and 33, each of the insulating films 30 is selectively etched using lithography and RIE to expose side surfaces of each of the stacked structures 22 and to form a plurality of the openings 32 reaching the semiconductor substrate 21. Subsequently, steps similar to those in the first embodiment are executed to form the N-type semiconductor layer 25, the P-type semiconductor layer 26, and the electrode layer 27 in the electrode layer 24.

Subsequently, the perovskite-containing oxide or binary transition metal oxide is deposited all over the top surface of the device to form the resistance changing layer 28 on the side surfaces of the stacked structures 22-1 and 22-2. The resistance charging layer 28 on the source/drain region 42 is subsequently etched using RIE. Furthermore, the resistance changing layer 28 on the stacked structure 22 is removed using, for example, CMP. The step of removing the resistance changing layer 28 is not necessarily required.

Figure 34:
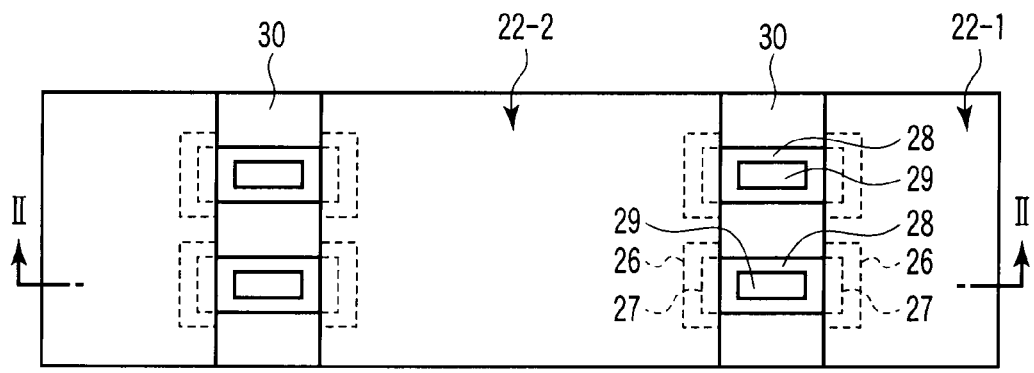
FIG. 34 is a plan view showing a step of manufacturing the ReRAM which is continued from the step in FIG. 32.
Figure 35:
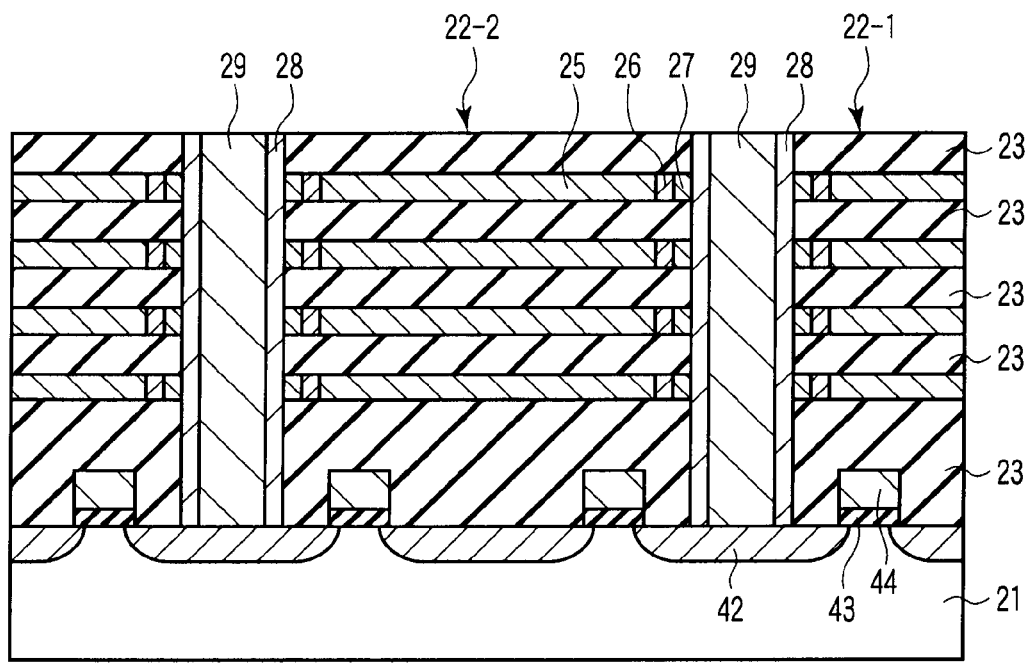
FIG. 35 is a sectional view showing a step of manufacturing the ReRAM taken along line II-II shown in FIG. 34.

Subsequently, as shown in FIGS. 34 and 35, a conductor is buried in each of the openings 32 to form the electrode layer 29 on the source/drain region 42 such that the electrode layer 29 contacts the side surface of the resistance changing layer 28. The electrode layer 29 on the stacked structure 22 is then removed using, for example, CMP.

Figure 36:
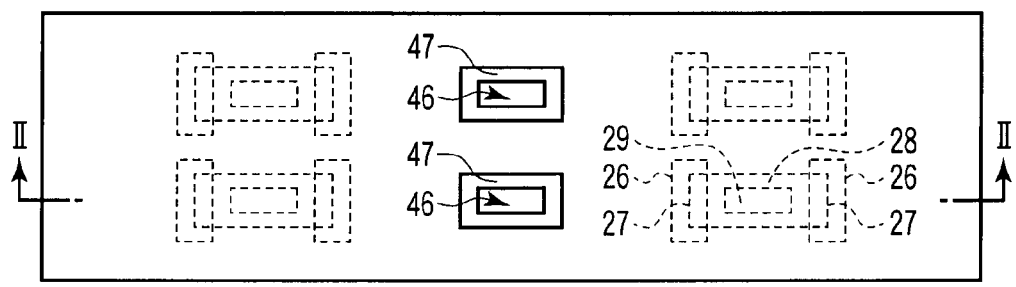
FIG. 36 is a plan view showing a step of manufacturing the ReRAM which is continued from the step in FIG. 34.
Figure 36:
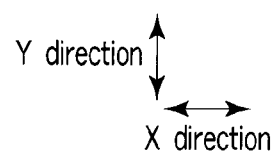
Figure 37:
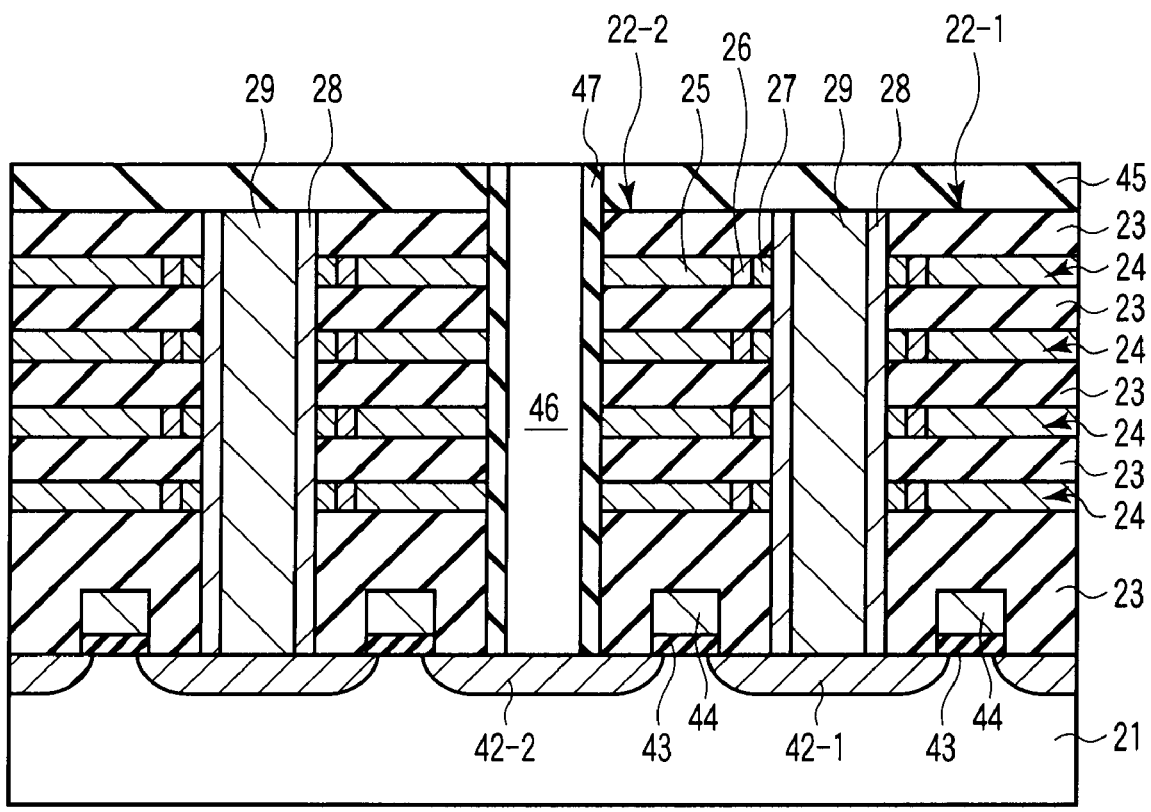
FIG. 37 is a sectional view showing a step of manufacturing the ReRAM taken along line II-II shown in FIG. 36.

Subsequently, as shown in FIGS. 36 and 37, the interlayer insulating layer 45 is formed on the stacked structure 22 to electrically separate the electrode layer 29 from the bit line BL. An opening 46 is subsequently formed in the stacked structure 22-2 to expose the source/drain region 42-2. The insulating film 47, electrically separating the N-type semiconductor layer 25 from the contact 48, is then formed in contact with the side surface of the stacked structure 22-2 which faces the opening 46.

Subsequently, as shown in FIGS. 20 to 23, a conductive layer is formed on the opening 46 and the interlayer insulating film 45. The conductive layer on the interlayer insulating film 45 is then patterned using lithography and RIE. Thus, the bit line BL is formed on the interlayer insulating film 45, and the contact 48, electrically connecting the source-drain region 42-2 and the bit line BL, is formed in the stacked structure 22-2. In this manner, the ReRAM according to the present embodiment is formed.

As described above in detail, according to the present embodiment, the two memory cell units adjacent to each other via the contact 48 in the X direction can share the word line WL. This can be achieved by providing the select transistor 13 that allows the selection of the memory cell unit to be connected to the bit line BL. This reduces the number of contacts connected to the word line WL to half of the number of contacts required according to the first embodiment. As a result, the cost of the ReRAM can be reduced. The other effects are the same as those of the first embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
    a first stacked structure in which a plurality of electrode layers are stacked on a substrate via insulating layers, each of the insulating layers disposed without an electrode;
    a first resistance changing layer provided on a side surface of the first stacked structure and in contact with the first electrode layers, the first resistance changing layer having a resistance value changing on the basis of an applied voltage;
    a second electrode layer provided on a side surface of the first resistance changing layer; and
    a bit line provided on the first stacked structure and electrically connected to the second electrode layer.

2. The device according to claim 1, wherein the first stacked structure includes a plurality of first diodes corresponding to the first electrode layers and electrically connected to the first electrode layers.

3. The device according to claim 2, wherein each of the first diodes comprises a first semiconductor layer of a first conductive type and a second semiconductor layer of a second conductive type, and
    the second semiconductor layer is sandwiched between the first semiconductor layer and the first electrode layer.

4. The device according to claim 3, wherein the first semiconductor layer, the second semiconductor layer, and the first electrode layer comprise the same layer.

5. The device according to claim 3, wherein the first electrode layer comprises metal silicide.

6. The device according to claim 1, wherein a bottom surface of the first resistance changing layer is at the same position as that of the first stacked structure, and
    a top surface of the first resistance changing layer is at the same position as that of the first stacked structure.

7. The device according to claim 1, further comprising:
    a second resistance changing layer provided on a side surface of the second electrode layer which is opposite the side surface of the second electrode layer which is in contact with the first resistance changing layer, the second resistance changing layer having a resistance value changing on the basis of an applied voltage; and
    a second stacked structure provided on the substrate and on the side surface of the second resistance changing layer and in which a plurality of third electrode layers are stacked via insulating layers, each of the third electrode layers being in contact with the second resistance changing layer.

8. The device according to claim 7, wherein the second stacked structure includes a plurality of second diodes corresponding to the third electrode layers and electrically connected to the third electrode layers.

9. A nonvolatile semiconductor memory device comprising:
    a semiconductor substrate;
    a first select transistor and a second select transistor provided on the semiconductor substrate and configured to share a first diffusion area;

a stacked structure provided on the first select transistor and the second select transistor via an interlayer insulating film and in which a plurality of first electrode layers are stacked via insulating layers;

a first resistance changing layer provided on a first side surface of the stacked structure and in contact with the first electrode layers, the first resistance changing layer having a resistance value changing on the basis of an applied voltage;

a second electrode layer electrically connected to a second diffusion area of the first select transistor and provided on a side surface of the first resistance changing layer;

a second resistance changing layer provided on a second side surface opposite to the first surface of the stacked structure and in contact with the first electrode layers, the second resistance changing layer having a resistance value changing on the basis of an applied voltage;

a third electrode layer electrically connected to a third diffusion area of the second select transistor and provided on a side surface of the second resistance changing layer;

a bit line provided on the stacked structure; and a contact which electrically connects a second diffusion area of the first select transistor to the bit line.

10. The device according to claim 9, wherein the stacked structure includes a plurality of first diodes corresponding to the first electrode layers and electrically connected to the first electrode layers.

11. The device according to claim 10, wherein each of the first diodes comprises a first semiconductor layer of a first conductive type and a second semiconductor layer of a second conductive type.

12. The device according to claim 11, wherein the first semiconductor layer, the second semiconductor layer, and the first electrode layer comprise the same layer.

13. The device according to claim 11, wherein the first electrode layer comprises metal silicide.

14. The device according to claim 11,
wherein the stacked structure includes a plurality of second diodes corresponding to the first electrode layers and electrically connected to the first electrode layers.

15. The device according to claim 14, wherein each of the second diodes comprises a third semiconductor layer of the first conductive type and
a fourth electrode layer of the second conductive type.

16. The device according to claim 9, wherein a bottom surface of the first resistance changing layer is at the same position as that of the stacked structure, and
a top surface of the first resistance changing layer is at the same position as that of the stacked structure.

17. A method of manufacturing a nonvolatile semiconductor memory device, the method comprising:
alternately stacking a plurality of first semiconductor layers of a first conductive type and a plurality of insulating layers to form a stacked structure on a substrate;
doping impurity of a second conductive type in side surface portions of the first semiconductor layers to form a plurality of second semiconductor layers in the first semiconductor layers, respectively;
allowing side surface portions of the second semiconductor layers to react with metal to form a plurality of first electrode layers in the second semiconductor layers, respectively;
forming a resistance changing layer on a side surface of the stacked structure and in contact with the first electrode layers, the resistance changing layer having a resistance value changing on the basis of an applied voltage; and
forming a second electrode layer on a side surface of the resistance changing layer.

18. The method according to claim 17, wherein side surfaces of the first semiconductor layers are exposed from an opening which separates the stacked structure in a plurality of pieces.

19. The method according to claim 18, wherein the opening reaches a bottom surface of the stacked structure.

* * * * *